United States Patent
Singleton et al.

(10) Patent No.: US 9,626,465 B2
(45) Date of Patent: Apr. 18, 2017

(54) ARBITER VERIFICATION

(71) Applicant: Imagination Technologies Limited, Kings Langley (GB)

(72) Inventors: Iain Singleton, Hemel Hempstead (GB); Ashish Darbari, Abbots Langley (GB); John Alexander Osborne Netterville, Cambridge (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 14/920,445

(22) Filed: Oct. 22, 2015

(65) Prior Publication Data

US 2016/0210381 A1 Jul. 21, 2016

(30) Foreign Application Priority Data

Jan. 16, 2015 (GB) .................................. 1500763.6

(51) Int. Cl.
*G06F 17/50* (2006.01)
(52) U.S. Cl.
CPC ...... *G06F 17/5009* (2013.01); *G06F 17/5022* (2013.01)
(58) Field of Classification Search
CPC ...................................................... G06F 17/50
USPC .......................................................... 716/108
See application file for complete search history.

(56) References Cited

U.S. PATENT DOCUMENTS 9,069,919 B1 6/2015 James
2011/0276817 A1* 11/2011 Fullerton .............. G06F 1/3203
713/324

* cited by examiner

*Primary Examiner* — Thuan Do
(74) *Attorney, Agent, or Firm* — Vorys, Sater, Seymour and Pease LLP; Vincent M DeLuca

(57) ABSTRACT

Operation of an arbiter in a hardware design is verified. The arbiter receives a plurality of requests over a plurality of clock cycles, including a monitored request and outputs the requests in priority order. The requests received by and output from the arbiter in each clock cycle are identified. The priority of the watched request relative to other pending requests in the arbiter is then tracked using a counter that is updated based on the requests input to and output from the arbiter in each clock cycle and a mask identifying the relative priority of requests received by the arbiter in the same clock cycle. The operation of the arbiter is verified using an assertion which establishes a relationship between the counter and the clock cycle in which the watched request is output from the arbiter.

17 Claims, 14 Drawing Sheets

INPUT PORT
3 2 1 0

HANDSHAKE IN VECTOR = [ 1 0 1 1 ]  212

INPUT PORT
3 2 1 0

HANDSHAKE OUT VECTOR = [ 0 0 1 0 ]  214

ARBITER VERIFICATION

BACKGROUND

Many hardware designs, such as memory sub-systems, contain resources that can receive more requests in a particular clock cycle than can be executed in a clock cycle. For example, a memory cache may have four requestors simultaneously requesting access to the cache, but the cache may only be able to execute or process one request per clock cycle. In these cases an arbitration scheme is required to determine the order in which the requests will be processed. In many cases the arbitration is done based on priorities assigned to the requestors so that requests from higher priority requestors are granted before requests from lower priority requestors. However, other arbitration schemes may also be used to prioritize the requestors and/or requests according to a specified arbitration policy.

Before a design is implemented in silicon the design is verified. This includes verifying that the design correctly implements the arbitration—i.e. prioritizes the requests according to the specified arbitration policy. Typically arbitration schemes are verified using dynamic simulation-based verification which involves applying input stimuli to the design implementation and comparing the output to a known reference output. However, dynamic simulation-based verification becomes difficult as the number of requestors grows since the number of cases and possible arbitration combinations becomes too large to test exhaustively.

The problem is exacerbated when requests can arrive both serially and concurrently. For example, a memory cache that is able to process only one request per clock cycle may receive two requests in a first clock cycle and then another two requests in a second clock cycle. The cache will not have processed both of the initial two requests before it receives the subsequent two requests. Accordingly, the arbitration scheme must implement a form of first-come-first-served selection in addition to priority selection. Exhaustively verifying that the arbitration is correct with respect to both selection parameters using dynamic simulation-based verification becomes an intractable task for a system with only a dozen requestors.

The embodiments described below are provided by way of example only and are not limiting of implementations which solve any or all of the disadvantages of known arbitration verification systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to methods and systems for verifying operation of an arbiter in a hardware design. The arbiter receives a plurality of requests over a plurality of clock cycles, including a monitored request. The method includes identifying the requests received by and output from the arbiter in each clock cycle. The priority of the watched request in the arbiter is then tracked using a counter that is updated based on the requests input to and output from the arbiter in each clock cycle and a mask identifying the relative priority of requests received by the arbiter in the same clock cycle. The operation of the arbiter is verified using an assertion which establishes a relationship between the counter and the clock cycle in which the watched request is output from the arbiter.

A first aspect provides a method of verifying operation of an arbiter in a hardware design, the arbiter receiving a plurality of requests over a plurality of clock cycles, the plurality of requests comprising a watched request, the method comprising, in a processor: identifying, for each clock cycle, any requests received by the arbiter in that clock cycle; identifying, for each clock cycle, any requests output from the arbiter in that clock cycle; tracking a priority of the watched request relative to other pending requests in the arbiter using a counter, the counter updated based on the requests identified as being received by and output from the arbiter in each clock cycle and a mask identifying a relative priority of requests received by the arbiter in a same clock cycle; and verifying operation of the arbiter using an assertion written in an assertion-based language, the assertion establishing a relationship between the counter and a clock cycle in which the watched request is output from the arbiter.

A second aspect provides a method of generating an electronic device comprising one or more arbiters, the method comprising: generating a hardware design for the electronic device; verifying the operation of at least one arbiter of the hardware design according to the method of the first aspect; modifying the hardware design based on the verification; and synthesizing the modified hardware design to generate the electronic device.

A third aspect provides a system to verify operation of an arbiter in a hardware design, the arbiter receiving a plurality of requests over a plurality of clock cycles, the plurality of requests comprising a watched request, the system comprising: request in logic configured to identify, for each clock cycle, any requests received by the arbiter in that clock cycle; request out logic configured to identify, for each clock cycle, any requests output by the arbiter in that clock cycle; counter update logic configured to track a priority of the watched request relative to other pending requests in the arbiter using a counter, the counter updated based on the requests identified as being received by and output from the arbiter in each clock cycle and a mask identifying a relative priority of requests received by the arbiter in a same clock cycle; and assertion verification logic configured to verify the operation of the arbiter using an assertion written in an assertion-based language, the assertion establishing a relationship between the counter and the clock cycle in which the watched request is output from the arbiter.

A fourth aspect provides a computer readable storage medium having encoded thereon computer readable program code for generating the verification system of the third aspect.

A fifth aspect provides a computer readable storage medium having encoded thereon computer readable program code which when run by a computer causes the computer to perform the method of the first aspect.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
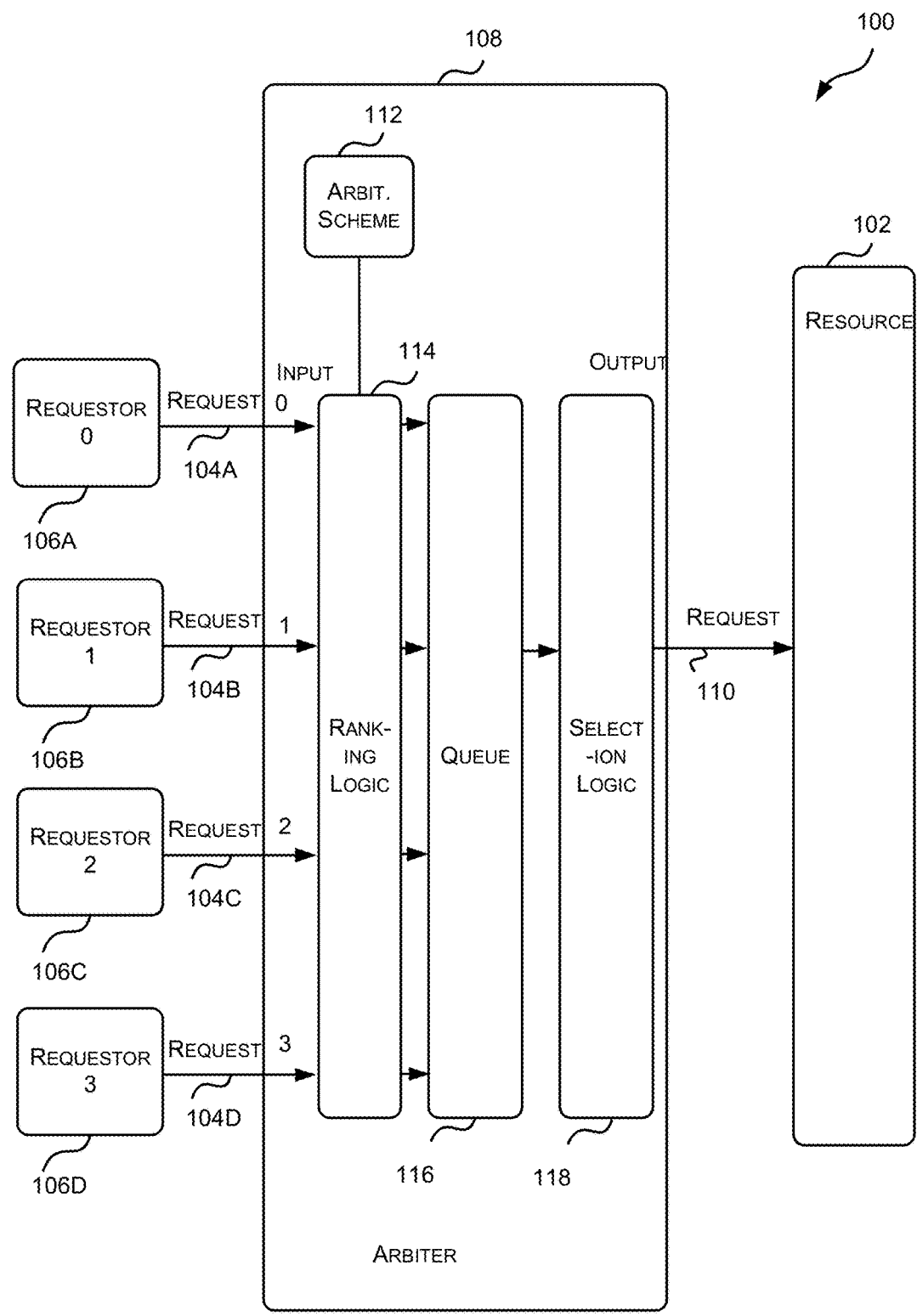
FIG. 1 is a block diagram of an example hardware design comprising an arbiter.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

As described above, many hardware designs, such as memory sub-systems, contain a shared resource that can receive more requests in a particular clock cycle than can be processed by the resource in a clock cycle. For example, FIG. 1 shows a hardware design 100 that has a resource 102 capable of receiving requests 104A, 1048, 104C, 104D from four requestors 106A, 106B, 106C and 106D in the same clock cycle, but is only capable of processing one request 104A, 104B, 104C or 104D per clock cycle. Accordingly, an arbiter 108 is used to prioritize the requests and output the requests to the resource 102 one at a time (e.g. request 110), in priority order according to the priorities specified in an arbitration scheme 112.

An arbitration scheme 112 is a set of rules that define the how the relative priority of requests 104A, 104B, 104C and 104D received in any clock cycle is to be determined. The priority may be based on the arbiter input port (i.e. inputs 0-3) on which the requests are received and/or the content of the requests. In some cases the arbitration scheme 112 specifies a static priority which results in the same priority being applied in each clock cycle. For example, the arbitration scheme may assign each input port of the arbiter 108 a fixed priority (e.g. input port 0 may be assigned the highest priority, input port 1 the next highest priority, input port 2 the second highest priority, and input port 3 the lowest priority).

In other cases the arbitration scheme 112 may specify a dynamic priority which results in different priorities being applied in different clock cycles. In one example, the arbitration scheme 112 may specify a round-robin priority scheme where the priority of the input ports changes each clock cycle. In another example, the arbitration scheme may specify that every other pending request (e.g. non-output request) is prioritized instead of prioritizing the requests in the order in which they arrived. In yet another example, the priority may be dynamically determined based on the content of the requests. In particular, the requests may include quality of service (QoS) information which may be used to determine the priority of the requests. It will be evident to a person of skill in the art that these are examples only and the methods and principles described herein may be applied to arbiters that implement other arbitration schemes.

In some cases, as shown in FIG. 1, the arbiter 108 may include ranking logic 114 that ranks the received requests according to the priorities specified in the arbitration scheme 112. The pending requests (requests received at the arbiter, but not output by the arbiter) may then be stored in priority order in a queue 116. The arbiter 108 (via, for example, selection logic 118) may then, in each clock cycle, select none, one, or more than one, of the highest ranked requests in the queue 116 to output. The number of requests selected may be based on the number of requests the resource can process in a clock cycle and the number of pending requests (e.g. the number of requests in the queue 116). In particular, the maximum number of requests that can be selected from the queue 116 and output may be based on the number of requests that can be processed by the resource 102 in a single clock cycle, but this is restricted by the number of pending requests. For example, where the resource 102 can only process one request per clock cycle, a maximum of one request can be selected and output. If however, there are no requests in the queue (e.g. no pending requests) then no requests can be selected and output to the resource 102.

In other cases, the pending requests (requests received by the arbiter 108, but not output by the arbiter 108) may be stored and/or selected for output in another manner. For example, the output selection logic may statically select a pending request to output directly from the inputs through a register, or even combinationally if the speed targets of the system implementation allow it.

Although the arbiter 108 of FIG. 1 is shown as a separate component from the resource 102, in other examples some, or all, of the arbiter 108 may form part of, or be integral to, the resource 102. For example, in some cases the selection logic 118 may form part of the resource 102. In particular, the resource 102 may select entries from the queue 116 based on the number of requests in the queue 116 and the number of requests the resource can process in a given clock cycle.

The term "hardware design" is used herein to refer to an analog or digital implementation of a specification (e.g. user specified functionality) for an electronic device (e.g. a processor) that is ultimately synthesized into silicon.

Before a hardware design, such as the hardware design 100 of FIG. 1, is implemented in silicon the hardware design 100 (including the arbiter) is verified. In particular, incorrect operation of an arbiter can lead to critical bugs in the design such as deadlock and starvation. Verifying the operation of an arbiter comprises verifying the following key requirements: (a) starvation freedom (i.e. that none of the requestors are prevented from accessing the resource); (b) race-freedom (i.e. that the requests are executed in the correct order if multiple requests arrive in the same clock cycle and do not cause a race-around condition); (c) deadlock freedom (i.e. that the arbiter does not get into a state where it is unable to process further requests); and (d) fairness (i.e. that each requestor get a fair chance of access based on the arbitration scheme 112). This includes verifying that the arbiter 108 correctly prioritizes the requests—i.e. prioritizes the requests according to the specified arbitration scheme 112.

Typically arbiters 108 are verified using dynamic simulation-based verification which involves applying input stimuli to the design implementation and comparing the output to a known reference output. However, dynamic simulation-based verification becomes difficult as the number of requestors grows since the number of cases and possible arbitration combinations becomes too large to test exhaustively.

As described above, the problem is exacerbated when requests can arrive both serially and concurrently. For example, the arbiter 108 of FIG. 1 may receive two requests in a first clock cycle and then another two requests in the subsequent clock cycle. Since the resource 102 can only process one request per clock cycle, the arbiter 108 can only output a maximum of one request per clock cycle. Therefore there will still be a pending request in the queue 116 when the subsequent two requests are received. Accordingly, the arbitration scheme 112 must implement a form of first-come-first-served ranking in addition to priority ranking. Exhaustively verifying the arbitration is correct with respect to both ranking parameters using dynamic simulation-based verification becomes an intractable task for a system with only a dozen requestors.

Dynamic simulation-based verification also typically requires a new verification test bench for each kind of arbiter (e.g. arbiters with different arbitration schemes, number of requestors/input ports etc.). Furthermore even if one simulation test bench was developed to verify different kinds of arbiters (e.g. arbiters with different arbitration schemes, number of requestors etc.) such a canonical piece of code would not be able to exhaustively check all the key requirements and prove the absence of starvation, deadlock, and race-freedom, and guarantee fairness.

Dynamic simulation-based verification also typically requires a significant amount of verification code (which often is redundant and overlapping) which makes review of results tedious and error prone.

Accordingly, embodiments described herein relate to assertion-based methods and systems for verifying the operation of an arbiter in a hardware design. In particular, the verification system comprises a mask, a counter and an assertion. One input port of the arbiter is arbitrarily selected as the "watched port" and the mask defines the relative priority of each input port with respect to the "watched port" (e.g. it identifies the other input ports that have higher priority and those that have lower priority than the watched port). The counter is used to indicate the priority of a "watched request" (a request received on the watched port) relative to the other pending requests. Until a request is received on the watched port the counter keeps track of the number of pending requests in the arbiter 108.

Once a watched request is received, the mask is used to identify the number of requests received in the same clock cycle that have a priority equal to or higher than the priority of the watched request. The counter is then incremented by this number so that the counter accurately reflects the priority of the watched request relative to the other pending requests. The counter then tracks the priority of the watched request relative to the other pending requests until the watched request is output by the arbiter 108. The assertion verifies that the watched request is output in the correct order by comparing the counter to the output(s) of the arbiter. A formal model checker verifies the assertion to confirm that all requests on the watched port are processed in the correct order.

The methods and systems described herein can be used to exhaustively verify the operation of an arbiter against all key requirements (starvation, deadlock, race-freedom and guarantee fairness). The methods and systems described herein are also reusable, meaning that they can be used with arbiters with any number of requestors and any arbitration scheme. In particular, the core system (e.g. system 200 of FIG. 2) can be dynamically loaded at test-time with the particulars for the arbiter to be tested.

Furthermore, since only a single assertion is used to prove all key requirements: absence of starvation, absence of deadlock, race-freedom and guarantee fairness the methods and systems described herein are said to have verification diversity.

The methods and systems described herein can also be implemented with significantly less verification code compared to dynamic-simulation based methods, making review of results and maintenance of the verification code easier.

The described verification system has been used to successfully verify a number of arbiter designs ranging from simple round-robin arbitration schemes to more complex arbitration schemes with hundreds of requestors. For example, for a 128 requestor arbiter, using 258 MB RAM (random access memory) on a 16 CPU (central processing unit) core machine the verification system was used to provide an exhaustive proof within 11 seconds of CPU verification time.

Figure 2:
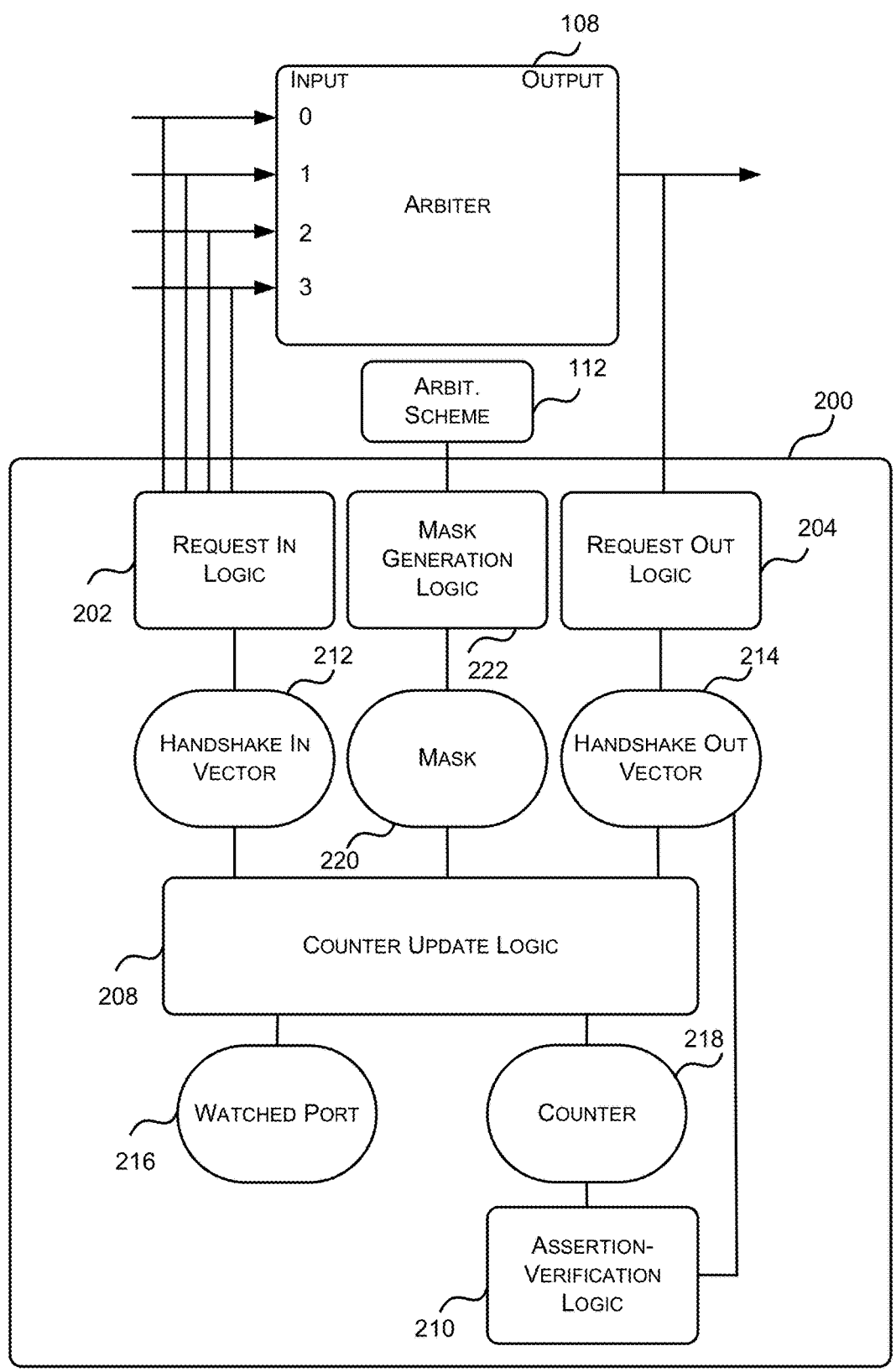
FIG. 2 is a block diagram of an example system for verifying operation of the arbiter of FIG. 1.

Reference is now made to FIG. 2 which illustrates an example verification system 200 for verifying the operation of an arbiter 108 in a hardware design 100. The system 200 comprises "request in" logic 202, "request out" logic 204, counter update logic 208, and assertion verification logic 210.

The request in logic 202 monitors each input port of the arbiter 108 to identify any requests input to the arbiter 108 in each clock cycle. For example, the request in logic may identify a request has been input to the arbiter when the request in logic 202 determines a request has been received or input on an input port. Each input port of the arbiter 108 is an interface through which a requestor 106A, 106B, 106C or 106D accesses the resource 102. One or more signals may be received and/or generated on each input port. Generally, each input port of the arbiter 108 is tied to or associated with a specific requestor 106A, 106B, 106C or 106D.

The request in logic 202 may determine that a request has been received on an input port of the arbiter 108 when the request in logic 202 detects a handshake signal or signals on that port. Different requestors may use different handshake signals. In some cases a valid signal and an enable signal are associated with each input port, and a handshake signal is detected when both the valid and enable signals associated with that input port are high in the same clock cycle. The particular handshake signal(s) associated with each input port may be determined from a specification file of the hardware design. For example, the particular handshake signals associated with each input port may be outlined in a table in a micro-architectural specification file.

The request in logic 202 generates a handshake in vector 212 each clock cycle indicating which input ports have received a request in that clock cycle. In some cases the handshake in vector 212 is implemented as a bit vector which comprises one bit for each input port of the arbiter 108. In some examples, a bit is set to "1" to indicate that a request was received on the corresponding input port and a bit is set to "0" to indicate that a request was not received on the corresponding input port. An example handshake in vector 212 will be described with reference to FIG. 3.

The request out logic 204 is configured to monitor the output port(s) of the arbiter 108 to identify any requests output by the arbiter 108. For example, the request out logic 204 may identify that a request has been output by the arbiter 108 when it determines a request has been output on an output port. Where the arbiter 108 can only output one request per clock cycle, the arbiter 108 may (as shown in FIG. 2) have only a single output port and requests from all input ports/requestors are output on that one output port. Alternatively, the arbiter 108 may have multiple output ports. For example, the arbiter 108 may have one output port for each input port and any requests received on a particular input port are output on the corresponding output port.

The request out logic 204 may determine that a request has been output by the arbiter 108 when the request out logic 204 detects a handshake signal or signals on an output port. For example, the request out logic 204 may detect a handshake signal when an enable signal and a valid signal related to an output port are both high in the same clock cycle.

In addition to determining when a request has been output by the arbiter 108, the request out logic 204 also identifies which input port (and where each input port is associated with a specified requestor, which requestor) an output request is associated with. In particular, the request out logic 204 determines which input port the output request was initially received on. Where the arbiter 108 has only a single output port the output requests may include information (e.g. an identifier) that indicates which input port/requestor 106A, 106B, 106C or 106D the request is associated with and the request out logic 204 uses this information to determine the corresponding input port/requestor for an output request. Where, however, the arbiter 108 has one output port for each input port, the request out logic 204 may determine the corresponding input port/requestor 106A, 106B, 106C or 106D for an output request based on the output port on which the request was output. For example, if the request was output on output port 0, the request out logic 204 may determine that the output request is associated with input port 0.

Each clock cycle the request out logic 204 generates a handshake out vector 214 that indicates if any requests were output and if so what input port an output request is associated with. In some cases the handshake out vector 214 is implemented as a bit vector which comprises one bit for each input port. In some examples, a bit is set to "1" to indicate that a request associated with the corresponding input port was output in the clock cycle, and a bit is set to "0" to indicate that a request associated with the corresponding input port was not output in the clock cycle. An example handshake out vector 214 will be described with reference to FIG. 3.

The counter update logic 208 is configured to update the counter 218 each clock cycle based on the handshake in vector 212, the handshake out vector 214, and a mask 220 so that the counter 218 accurately represents the priority of the most recent watched request relative to the other pending requests.

During verification the verification tool non-deterministically selects one input port of the plurality of input ports of the arbiter 208 as a watched port 216. Requests made on the watched input port (referred to herein as watched requests) are then monitored to ensure that they are output by the arbiter 108 in the correct order according to the arbitration scheme 112.

The mask 220 indicates which input ports have a lower priority than the watched port based on the arbitration scheme 112. Where each input port corresponds to a particular requestor as shown in FIG. 1, the mask 220 can be said to indicate the priority of the requestors 106A, 106B, 106C and 106D. In some cases the mask 220 is implemented as a bit vector comprising a bit for each input port. The bit indicates whether the corresponding input port has a lower priority than the watched port. For example, a bit value of "0" may be used to indicate that the corresponding input port has a lower priority, and a bit value of "1" may be used to indicate the corresponding input port does not have a lower priority (e.g. it is a watched input port or it is an input port with a higher priority). An example mask 220 will be described with reference to FIG. 4.

Since the watched port is randomly selected, a mask may be stored for each port in a mask table where each row of the table represents the mask for a particular input port. The appropriate mask is then selected by the counter update logic 208 once the watched port 216 has been selected.

Where the arbitration scheme 112 specifies a fixed priority only a single mask or mask table may be stored. Where, however, the arbitration scheme specifies a dynamic priority (e.g. the priority can be different for different clock cycles) multiple masks or multiple mask tables may be stored and the counter update logic 208 may be configured to select the appropriate mask for the particular watched port and the particular clock cycle.

Until a request has been received at the watched port 216 the counter 218 is used to keep track of the number of pending requests in the arbiter 108. In particular, during each clock cycle the counter update logic 208 increments the counter 218 by the number of requests input to the arbiter 108 in that clock cycle and decrements the counter 218 by the number of requests output by the arbiter 108 in that clock cycle. The number of requests input to the arbiter 108 can be determined from the handshake in vector 212. For example, where the handshake in vector 212 is implemented as a bit vector the number of requests input to the arbiter 108 is equal to the number of "1's" in the handshake in vector 212. Similarly, the number of requests output by the arbiter 108 can be determined from the handshake out vector 214. For example, where the handshake out vector 214 is implemented as a bit vector the number of requests output by the arbiter 108 is equal to the number of "1's" in the handshake out vector 214.

Once a request from the watched port 216 (the watched request) is input to the arbiter 108 the counter 218 is used to keep track of the priority of the watched request relative to the other pending requests. In particular, if at least one other request is received or input in the same clock cycle as the watched request, the counter update logic 208 uses the mask 220 to mask out the requests having a lower priority. The number of remaining requests (the watched request and any higher priority requests) is then added to the counter 218 so that the counter 218 represents the priority of the watched request relative to the other pending requests.

In some cases, the counter update logic 208 is configured to determine how many of the requests received in the same clock cycle as the watched request have a priority equal to or higher than the watched request by performing an AND operation on the handshake in vector and the mask 220 to produce a masked handshake in vector. The number of requests that have a priority equal to or greater than the watched request is then equal to the number of "1's" in the masked handshake in vector. An example of using the mask to identify the number of requests with a priority equal to or greater than the watched request will be described with reference to FIG. 5.

In each clock cycle following the clock cycle in which a watched request is received the counter update logic 208 decrements the counter 218 for each request output from the arbiter 108 to reflect the fact that the watched request has moved up in the priority rankings. For example, if a watched request initially has the fifth highest priority of the pending requests, after a pending request (the highest priority request) is output, the watched request will have the fourth highest priority of the pending requests. In these clock cycles the counter is not incremented since the watched request cannot move down in the priority rankings.

The assertion-verification logic 210 periodically assesses one or more assertions to verify that the watched requests are output by the arbiter 108 in the correct order according to the arbitration scheme 112. As is known to those of skill in the art an assertion is a statement about a specific property that is expected to hold for a design (e.g. is always true). In other words, an assertion is an expression that, if evaluated to be false on the design, indicates an error. Within HDL designs, an assertion is an executable statement that checks for specific behavior within the HDL design. For example if a design contains a FIFO (first in first out) buffer the designer would define assertions that capture the design intent (e.g. that neither overflow nor underflow of the FIFO may occur).

An assertion is typically written in an assertion language. Assertion languages include, but are not limited to, System Verilog (SV), Property Specification Language (PSL), Incisive Assertion Library (IAL), Synopsys OVA (Open Vera Assertions), Symbolic Trajectory Evaluation (STE), SystemC Verification (SCV), 0-In, Specman, and OpenVera Library (OVL).

In one example, the assertion verification logic 210 evaluates a single assertion that confirms that the watched request is output at the correct time by comparing the counter 218 to the handshake out vector 214 (or a variant thereof). In particular, the assertion establishes a relationship between the counter value and the clock cycle in which the watched request is output which must hold true for the arbiter to be operating correctly.

In cases where the arbiter 108 can output a maximum of one request per clock cycle, the assertion may establish or assert that the watched request must be output when the counter is equal to a certain value. For example, where a counter value of one indicates the watched request has the highest priority of the pending requests (e.g. the watched request is at the front of the queue 116) then the watched request is expected to be output in the clock cycle after the counter is equal to one. Accordingly, in this example, the assertion may establish or assert that in the clock cycle immediately following the clock cycle in which the counter is equal to one the watched request is output.

In cases where the arbiter 108 can output more than one request per clock cycle, the assertion may establish or assert that the watched request must be output when the counter is equal to or less than a particular value. This is because the watched request does not have to be the highest priority request to be output from the arbiter so the watched request may be output from the arbiter when the counter is one of a plurality of values. For example, where a counter of 1 indicates the watched request has the highest priority of the pending requests then the watched request is expected to be output in the clock cycle when the counter is less than or equal to the number of request output from the arbiter. For example, if the counter is 1 or 2, indicating that the watched request has the highest or second highest priority respectively, the watched request will be output if two requests are output from the arbiter. Accordingly, in this example, the assertion may establish or assert that the watched request is output in the clock cycle in which the counter is less than or equal to the number of requests output.

It is noted that when the system is implemented in a formal verification tool, the formal verification tool chooses all possible input ports to be the watched input port and for a given watched input port chooses all possible combinations over time—e.g. the formal verification tool chooses or tries all combinations of 'when' or 'which clock cycle' the watched input port receives a request. Thus all inter-leavings are checked.

Accordingly the system 200 uses a single assertion to verify all key verification requirements: absence of starvation, race-freedom, absence of deadlock, and guarantee fairness. In particular, by using a symbolic watched port, and making each input port the watched port, if any input port (and associated requestor) was starved access then requests input on that input port would never be seen output from the arbiter and the assertion would fail. Furthermore, because the system 200 is designed to ensure priority is enforced, if there were any race conditions which resulted in incorrect order of service (i.e. the requests are output in the wrong order) then the assertion would fail. In addition, if the arbiter was to get into a deadlock state that did not allow it to process any more requests then the watched request would not be output in some scenarios. Since the formal tool checks all scenarios those scenarios would be identified causing the assertion to fail.

In some cases, the system 200 may also comprise mask generation logic 222 for dynamically generating the mask 220 or masks from the arbitration scheme 112. For example, once the watched port has been selected the mask 220 or masks for the selected watched port may be dynamically generated by the mask generation logic 222 from the arbitration scheme 112. By dynamically generating the mask 220 the state space needed to store all possible masks (e.g. each mask for each port) and select the correct one is minimized. The arbitration scheme 112 may be manually input into the mask generation logic 222 or the arbitration scheme 112 may be dynamically obtained from the configuration file of the hardware design.

Although not shown, each of the components of the system 200 is controlled by a main clock. For example, in some cases the components of the system 200 are triggered by the rising edge or positive edge of the main clock.

Figure 3:
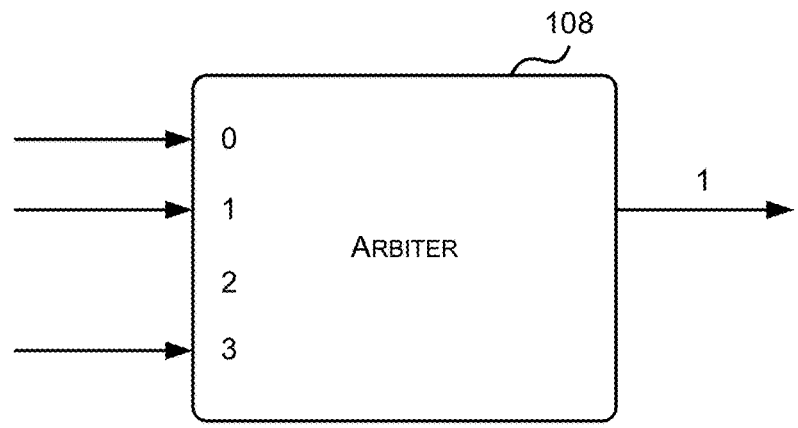
FIG. 3 is a schematic diagram of example handshake in and handshake out vectors.

Reference is now made to FIG. 3 which illustrates example handshake in and handshake out vectors 212 and 214. As described above, the handshake in vector 212 indicates, for a particular clock cycle, which input ports of the arbiter 108 have received a request. As shown in FIG. 3, the handshake in vector 212 may be implemented by a bit vector that comprises a bit for each input port of the arbiter 108. Each bit indicates whether a request was received by the arbiter 108 on the corresponding input port. In the example shown in FIG. 3 when a bit is set to "1" the corresponding input port received a request and when a bit is set to "0" the corresponding input port did not receive a request. Accordingly, where the arbiter 108 has four input ports numbered 0 to 3 and receives for a particular clock cycle requests on input ports 0, 1 and 3 the handshake in vector 212 will be equal to [1 0 1 1] (where the most significant bit position corresponds to port 3).

Similarly, the handshake out vector 214 indicates, for a particular clock cycle, which input ports (or requestors) any output requests relate to. As shown in FIG. 3, the handshake out vector 214 may be implemented as a bit vector that comprises a bit for each input port of the arbiter 108. Each bit indicates whether a request was output by the arbiter 108 that relates to the corresponding input port. In the example shown in FIG. 3 when a bit is set to "1" the arbiter has output a request that relates to the corresponding input port and when a bit is set to "0" the arbiter has not output a request that relates to the corresponding input port. Accordingly, where the arbiter 108 outputs a request related to input port 1, the handshake out vector 214 will be equal to [0 0 1 0].

It will be evident to a person of skill in the art that these are examples only and the handshake in and handshake out vectors may be implemented in other manners.

Figure 4:
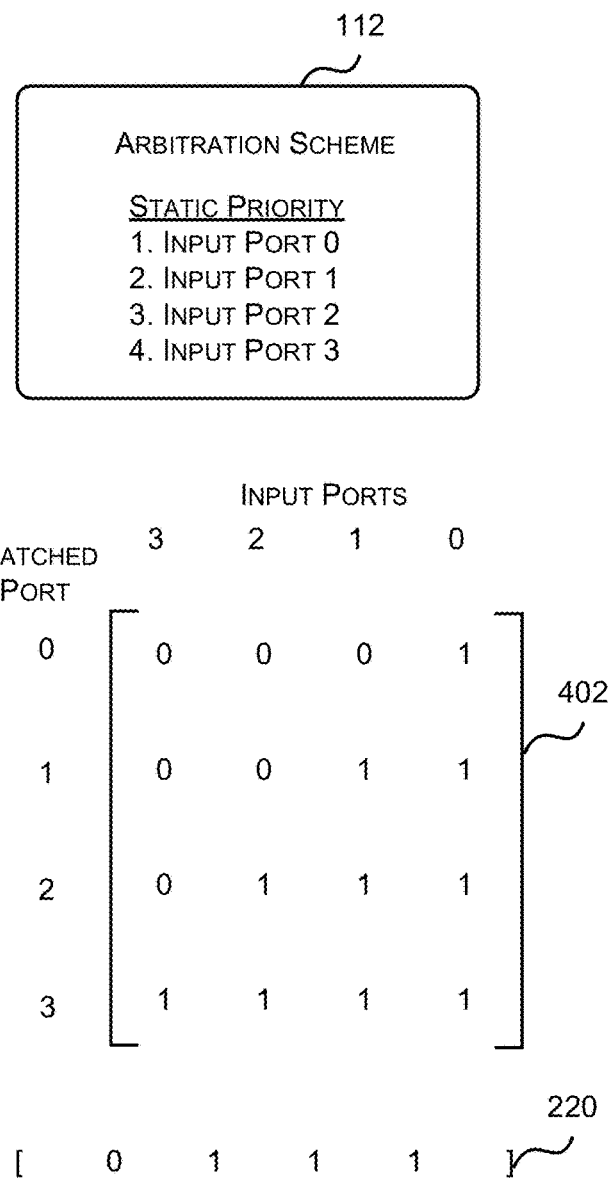
FIG. 4 is a schematic diagram of an example mask.

Reference is now made to FIG. 4 which illustrates an example mask 220 of FIG. 2. As described above, the mask 220 indicates which input ports have a lower priority and which input ports have a higher priority than the watched port as specified by the arbitration scheme 112. FIG. 4 illustrates an example arbitration scheme 112 which specifies that input port 0 has the highest priority, input port 1 has the second highest priority, input port 2 has the third highest priority and input port 3 has the lowest or fourth highest priority.

As shown in FIG. 4 the mask 220 may be implemented as a bit vector comprising a bit for each input port that indicates whether that input port has a higher or lower priority than the watched port. For example, where there are four input ports the mask would have four bits. In some cases when a bit is set to "1" the corresponding input port has a higher priority or an equal priority to the watched port and when a bit is set to "0" the corresponding input port has a lower priority relative to the watched port. For example, the example arbitration scheme 112 of FIG. 4 dictates that only input port 3 has a lower priority than input port 2 thus the mask 220, when input port 2 is the watched port, is equal to [0 1 1 1].

In some cases the mask for each input port is stored in a mask matrix 402 where each row of the matrix represents the mask for a particular input port. For example, FIG. 4 illustrates an example mask matrix 402 for the example arbitration scheme 112 shown in FIG. 4. In particular, since there are four input ports in the arbitration scheme 112 there are four rows in the mask matrix 402 and each row has four bits, one for each input port.

As described above, the mask 220 is used by the counter update logic 208 to determine the number of requests which arrive in the same clock cycle as a request from the watched port that have a priority that is equal to or higher than the request on the watched port. In other words, the mask 220 is used to "mask out" or disregard the requests received in the same clock cycle as a watched request that have a lower priority than the watched request. The counter 218 is then updated by the number of requests remaining after the lower priority requests have been masked out.

Figure 5:
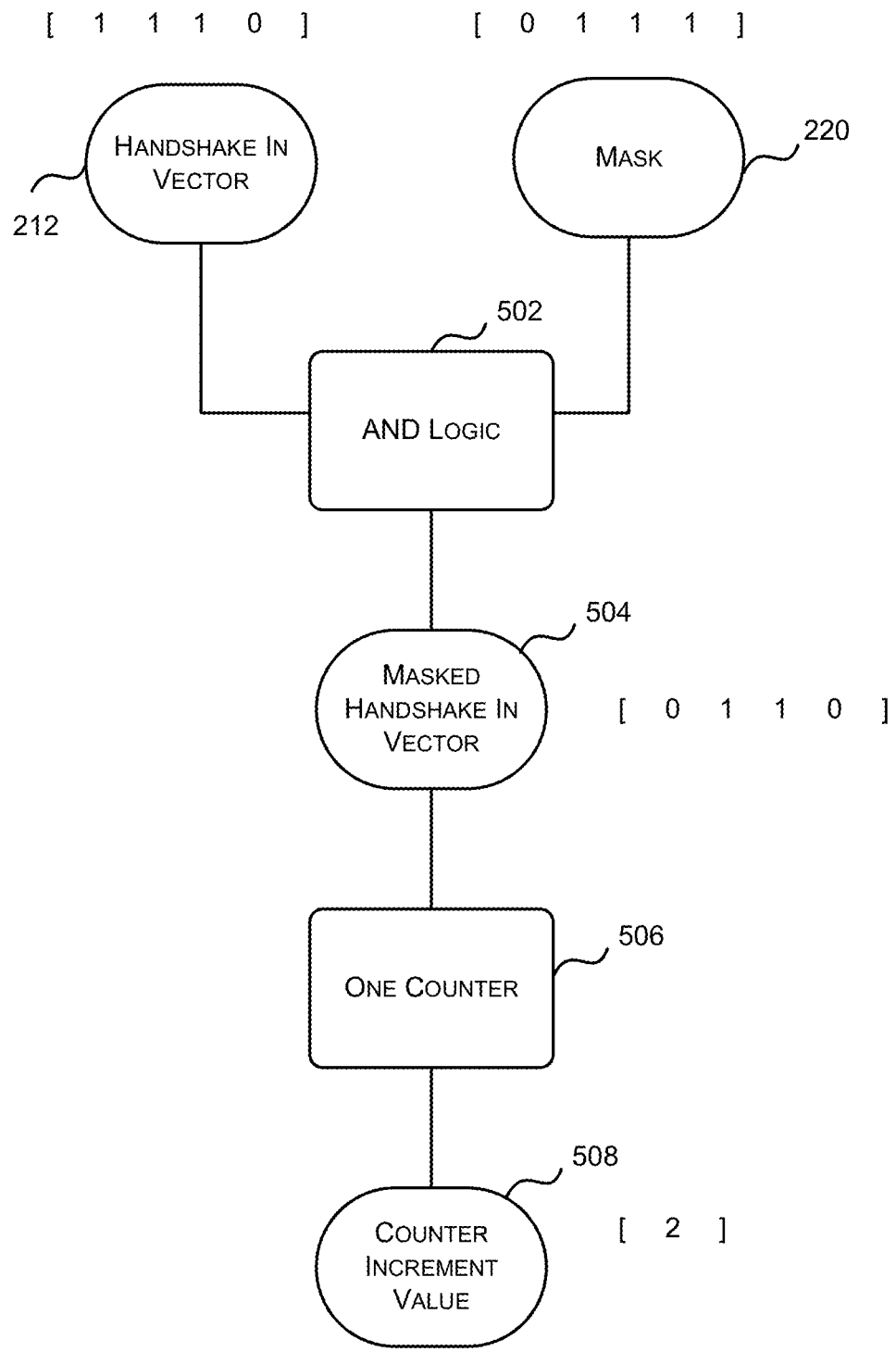
FIG. 5 is a schematic diagram illustrating generating a masked handshake in vector using the mask of FIG. 4.

Reference is now made to FIG. 5 which illustrates use of the mask 220 to identify the requests that have a lower priority than the watched request. In particular, as shown in FIG. 5, the handshake in vector 212 and the mask 220 are supplied to AND logic 502 which performs a bit-wise AND operation on the handshake in vector 212 and the mask 220 to produce a masked handshake in vector 504. For example, as shown in FIG. 5, if the handshake in vector 212 is equal to [1 1 1 0] indicating that requests have been received at the arbiter 108 on ports 1, 2 and 3 in the same clock cycle, and the mask 220 for the watched port (port 2) is [0 1 1 1] indicating the requests on port 3 have a lower priority than the requests on port 2, a bit-wise AND operation on the handshake in vector 212 and the mask 220 produces a masked handshake in vector 504 of [0 1 1 0].

The masked handshake in vector 504 is then provided to a one counter 506 which counts the number of 1's in the masked handshake vector 504 to produce a counter increment value 508. For example, if, as shown in FIG. 5, the masked handshake vector is [0 1 1 0] then the one counter 506 will produce a counter increment value 508 of 2.

Once the counter increment value 508 has been generated the counter is incremented by the counter increment value 508. For example, if the current counter value is 2 and the counter increment value is 2 then the counter will be incremented by 2 to a final value of 4 to indicate that the request for the watched port (e.g. input port 2) has the fourth highest priority of the pending requests (e.g. it is the fourth request in the arbiter queue 116).

Figure 6:
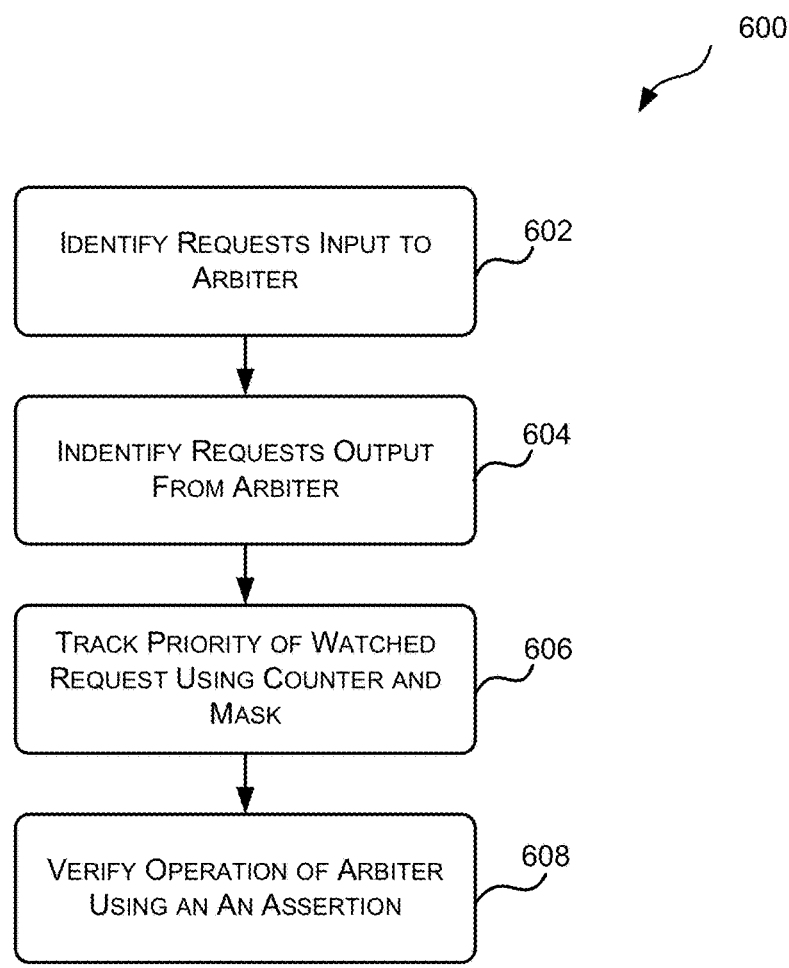
FIG. 6 is a flow chart of a method for verifying the operation of an arbiter using the arbiter verification system of FIG. 2.

Reference is now made to FIG. 6 which illustrates a method 600 for verifying the operation of an arbiter 108 using the system 200 of FIG. 2. The method 600 begins at block 602 where the requests input into the arbiter 108 are identified. As described above, the input ports of the arbiter 108 may be identified by request in logic 202 which determines which input ports have received a request in each clock cycle. The request in logic 202 then generates a handshake in vector 212 for each clock cycle that indicates which ports received a request in that clock cycle. The handshake in vector 212 may be implemented as a bit vector that comprises a bit for each input port of the arbiter 108. The value of a bit indicates whether the corresponding input port received a request in that clock cycle. The method 600 then proceeds to block 604.

At block 604 the requests output from the arbiter 108 are identified. The output port(s) of the arbiter 108 may be identified by request out logic 204 which determines whether any requests have been output by the arbiter and if so, which input ports (or which requestors) they are associated with (i.e. which input port the request was received on). The request out logic 204 then generates a handshake out vector 214 for each clock cycle that indicates whether any requests were output in that clock cycle, and if so, which input ports (or requestors) they are associated with. The handshake out vector 214 may be implemented as a bit vector that comprises a bit for each input port of the arbiter 108. The value of a bit indicates whether a request associated with the corresponding input port was output in that clock cycle. The method 600 then proceeds to block 606.

At block 606 the priority of a watched request relative to the other pending requests in the arbiter 108 is tracked using a counter 218 and a mask 220. As described above, one of the input ports of the arbiter 108 is designated as the watched input port and a request received on the watched input port is designated a watched request. The priority of the watched request relative to the other pending requests in the arbiter 108 is tracked by counter update logic 208.

In particular, until a watched request is received by, or input to, the arbiter 108 the counter update logic 208 keeps track of the number of pending requests in the arbiter 108 (e.g. the number of requests in the queue 116) by incrementing the counter by the number of requests received in a clock cycle and decrementing the counter by the number of requests output in that clock cycle. The number of requests received and the number of requests output is determined from the handshake in and handshake out vectors 212 and 214 respectively.

Once a watched request is received, the counter update logic 208 uses the mask 220 and the handshake in vector 212 to determine the priority of the watched request relative to the other pending requests in the arbiter 108 (e.g. the position of the watched request in the queue 116). In particular, the mask 220 is used to identify which requests received in the same clock cycle as the watched request have a lower priority than the watched request according to the arbitration scheme 112. The counter 218 is then incremented by the number of requests received or input less the number of those requests which have a lower priority than the watched request. The counter is also decremented by the number of requests output by the arbiter. The counter then represents the priority of the watched request relative to the other pending in the arbiter 108.

Each clock cycle after the watched request is received, the counter update logic 208 decrements the counter 218 by the number of requests output by the arbiter 108 to reflect the fact that each time a request is output the watched request moves up in the priority rankings. An example method for tracking the priority of a watched request using a counter and a mask is described with reference to FIG. 7. The method 600 then proceeds to block 608.

At block 608 an assertion is evaluated to determine whether the arbiter is operating as expected (i.e. it is outputting requests in accordance with the arbitration scheme). The assertion establishes a relationship between the counter and the clock cycle in which the watched request is output from the arbiter 108. In some cases the assertion asserts that in the clock cycle that the counter is equal to a predetermined value the watched request is output from the arbiter. For example, the assertion may assert that in the clock cycle the counter is equal to zero, the watched request is output from the arbiter. In another example, the assertion may assert that in the clock cycle immediately following the clock cycle in which the counter is equal to one, the watched request is output from the arbiter. If the assertion is true then the arbiter 108 is operating as expected. If however, the assertion is not true then there is an error.

Once the verification is complete the hardware design may be modified based on the outcome of the verification. For example, if the verification identifies an error in the operation of the arbiter then the hardware design may be modified to correct the error. The modified hardware design may then be re-verified and once verified to be operating as expected the modified hardware design may be synthesized to generate an electronic device.

Figure 7:
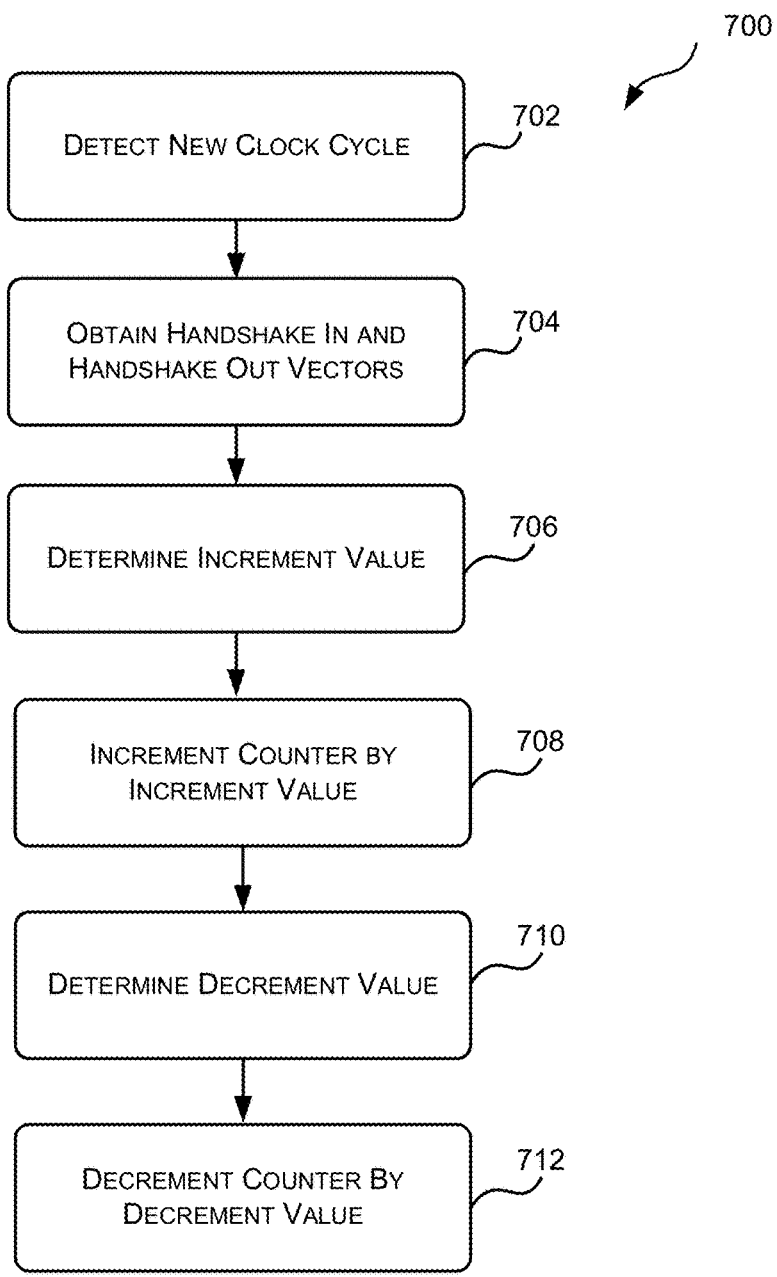
FIG. 7 is a flow chart of a method for tracking the priority of a watched request in relation to the other pending requests in the arbiter.

Reference is now made to FIG. 7 which illustrates a method 700 for tracking the priority of a watched request relative to the other pending requests in the arbiter which may be executed by the counter update logic 208 of FIG. 2. The method 700 starts at block 702 where the counter update logic 208 detects a new clock cycle. Once a new clock cycle has been detected, the method 700 proceeds to block 704. At block 704 the counter update logic 108 obtains the handshake in and handshake out vectors 212 and 214. Once the handshake in and out vectors 212 and 214 have been obtained the method 700 proceeds to block 706.

At block 706, the handshake in vector 212 is analyzed to determine an increment value for the counter. The determination of the increment value depends on whether a request on the watched port has been received by or input to the arbiter 108.

If no request on the watched port has been received (in the current clock cycle or in any previous clock cycle) then the counter keeps track of the number of pending requests in the arbiter (e.g. the number of requests in the queue 116). Since any new requests received will become a pending request the increment value in this case is equal to the number of new requests received in the current clock cycle. Where the handshake in vector is implemented as a bit vector the number of new requests is equal to the number of one's in the handshake in vector.

If a request on a watched port is received in the current clock cycle then the counter is used to represent the priority of the watched request relative to the other pending requests in the arbiter. Accordingly, if the request is the only new request in the clock cycle then the increment value is one. If there is at least one other new request in the clock cycle then the increment value is the total number of new requests received less the number of new requests that have a lower priority than the watched request. As described above with respect to FIG. 5 this can be determined by applying the mask 220 to the handshake in vector 212 to generate a masked handshake in vector and then counting the number of ones in the masked handshake in vector. Once a request has been received on a watched port a flag (referred to herein as "sample_in") may be set indicating that a watched request has been received.

If a request on a watched port was received in a previous clock cycle (e.g. the "sample_in" flag is set) then the increment value is zero as the watched request cannot move down in the priority rankings, it can only move up as pending requests are output from the arbiter.

An example method for determining the increment value will be described below with reference to FIG. 8. Once the increment value has been determined the method 700 proceeds to block 708.

Figure 10:
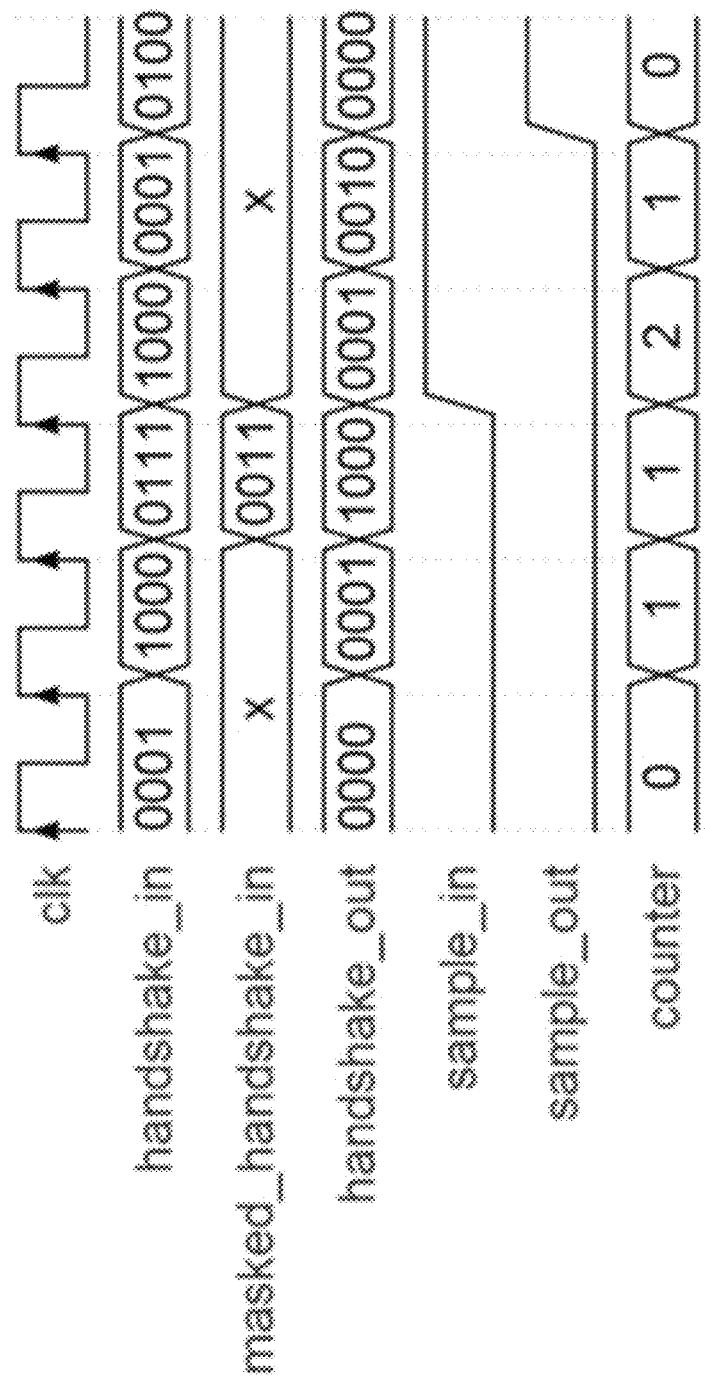
FIG. 10 is an example timing diagram of the signals in the arbiter verification system of FIG. 2 for an arbiter that can output only a single request per clock cycle.
Figure 11:
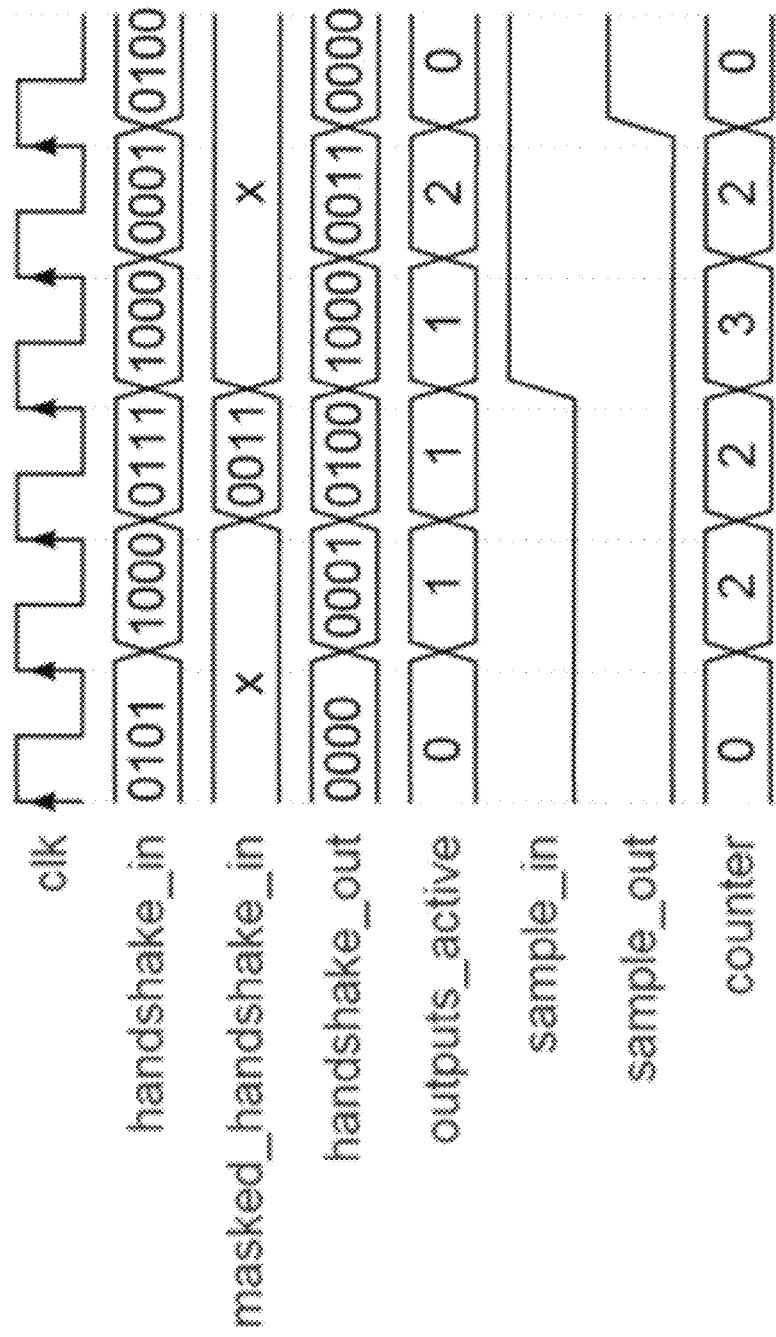
FIG. 11 is an example timing diagram of the signals in the arbiter verification system of FIG. 2 for an arbiter that can output more than one request per clock cycle.

At block 708, the counter is incremented by the increment value determined in block 706. In some cases, as shown in FIGS. 10 and 11 the counter may not be incremented until the next clock cycle. Once the counter has been incremented the method 700 proceeds to block 710.

At block 710, the handshake out vector 214 is analyzed to determine a decrement value for the counter. When a request is output from the arbiter the number of pending requests is reduced and any pending request in the arbiter is moved up in the priority rankings. Accordingly, regardless of whether the counter is being used to track the number of pending requests in the arbiter or the priority of the watched request relative to the other pending requests, the decrement value is equal to the number of requests output from the arbiter. Where the arbiter can only output a maximum of one request per clock cycle, the decrement value will either be equal to one (i.e. one request has been output) or zero (i.e. no requests have been output). As described above, when the handshake out vector is implemented as a bit vector the decrement value may be determined by counting the number of ones in the handshake out vector. Once the decrement value has been determined the method 700 proceeds to block 712.

At block 712, the counter is decremented by the decrement value determined in block 710. In some cases, as shown in FIGS. 10 and 11 the counter may not be decremented until the next clock cycle. Once the counter has been decremented the method 700 ends.

Figure 8:
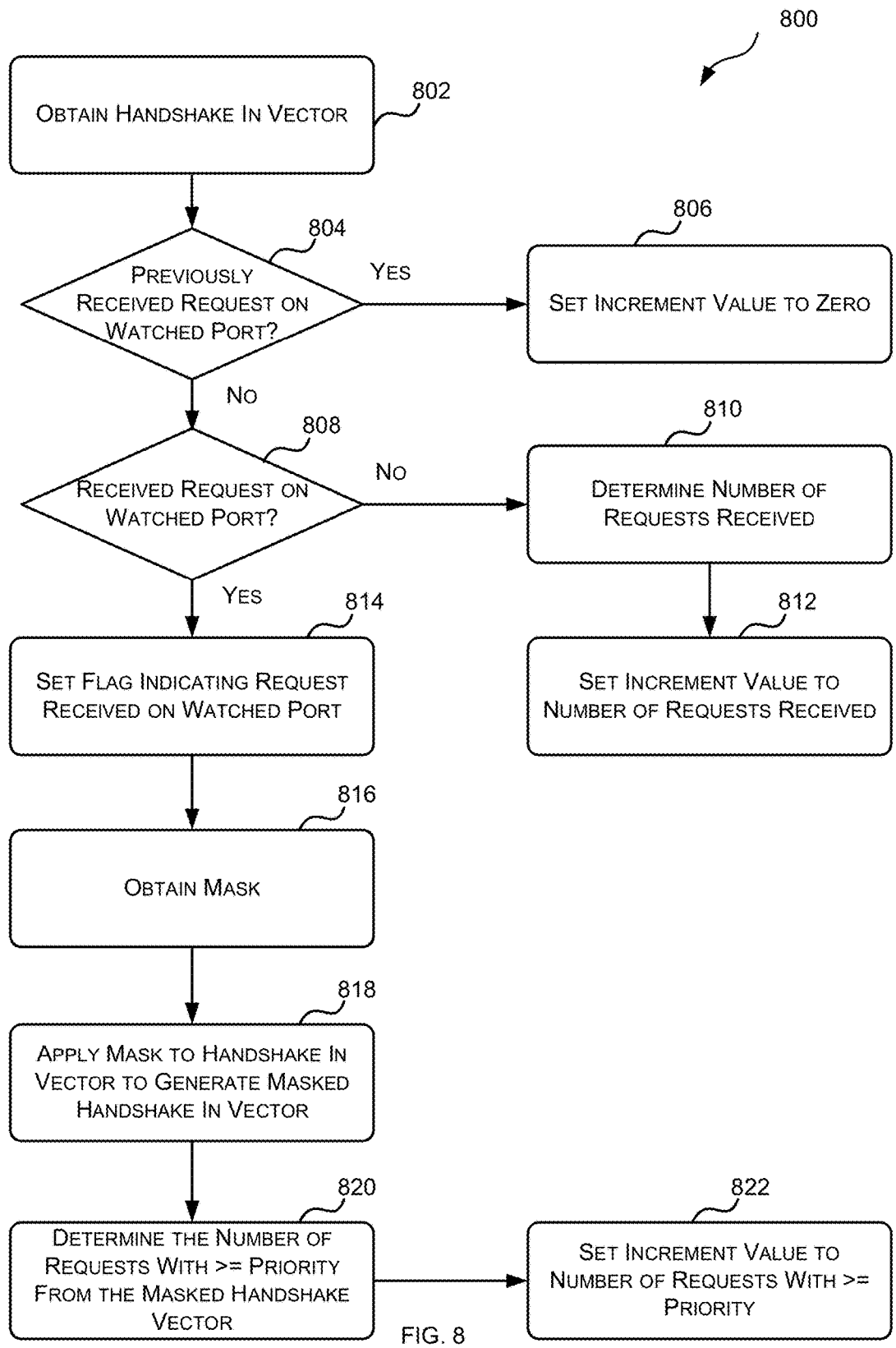
FIG. 8 is a flow chart of an example method for determining the counter increment value.

Reference is now made to FIG. 8 which illustrates a method 800 for determining an increment value for the counter which may be executed by the counter update logic 208 at block 706 of the method 700 of FIG. 7. The method 800 begins at block 802 where the counter update logic 208 obtains the handshake in vector 212. The method 800 then proceeds to block 804.

At block 804 it is determined whether a watched request was received in a previous clock cycle but not output (i.e. that there is a pending watched request). Where a flag (e.g. sample_in) is set after a watched request is received by or input to the arbiter 108, and a flag (e.g. sample_out) is set after a watched request is output from the arbiter 108, then determining whether a watched request was received in a previous clock cycle but not output may comprise checking to see if the sample_in flag is set and the sample_out flag is not set.

If it is determined that a watched request was received by or input to the arbiter in a previous clock cycle, but not output from the arbiter, then the number of requests received in the current clock cycle does not affect the position of the watched request in the priority rankings since these requests were received after the watched request and will have a lower priority than the watched request. As a result, if a watched request has been received in a previous clock cycle the method 800 proceeds to block 806 where the increment value is set to zero. If, however, it is determined that a watched request was not received in a previous clock cycle then the method 800 proceeds to block 808.

At block 808, it is determined whether a watched request was received by or input to the arbiter 108 in the current clock cycle. Determining whether a watched request was received by or input to the arbiter 108 in the current clock cycle may comprise analyzing the handshake in vector to determine if it indicates a request was received on the watched port. Where the handshake in vector is implemented as a bit vector, determining whether a watched request was received or input to the arbiter 108 may comprise determining whether the bit corresponding to the watched port is set (e.g. has a value of one).

If it is determined that a watched request was not received by, or input to, the arbiter 108 in the current clock cycle then a watched request has not yet been received and any request received in the current cycle will precede the watched request in the priority rankings (i.e. they will have a higher priority than the watched request). Accordingly, the method 800 proceeds to block 810 where the number of new requests received by or input to the arbiter in the current clock cycle is determined from the handshake in vector. Where the handshake in vector is implemented as a bit vector the number of new requests received by, or input to, the arbiter is determined by counting the number of ones in the handshake in vector. The method 800 then proceeds to block 812 where the increment value is set to the number of new requests received by, or input to, the arbiter 108 as determined in block 810.

Where, however, it is determined that a watched request was received by or input to the arbiter 108 in the current clock cycle the method 800 proceeds to block 814.

At block 814, a flag (e.g. sample_in) is set to indicate that a watched request has been received. Once the flag has been set the method 800 proceeds to block 816.

At block 816, the mask is obtained. As described above the mask identifies which input ports have a higher priority than the watched port and which input ports have a lower priority than the watched port. Where the watched port is dynamically selected the appropriate mask for the selected watched port is obtained or generated. Furthermore, where the priority is dynamic (e.g. it can be different in different clock cycles) the appropriate mask for the selected watched port and the particular clock cycle may be selected or generated. For example, where the arbitration scheme 112 specifies a round-robin priority scheme, a different priority will be implemented each clock cycle thus the mask corresponding to the selected watched port and the priority to be applied in the current clock cycle is selected or generated. Once the mask has been obtained, the method 800 proceeds to block 818.

At block 818, the mask obtained in block 816 is applied to the handshake in vector so that the requests received in the same clock cycle as the watched request that have a lower priority than the watched request are masked or ignored. In particular, the mask is used to determine the exact priority of the watched request relative to the other pending requests in the queue. For example, if there are currently five pending requests in the arbiter and three more requests arrive (including the watched request) a determination of whether the watched request will have the sixth, seventh or eighth highest priority is dependent on the relative priority of the three requests that were received by, or input to, the arbiter in the same clock cycle. Any requests received in the same clock cycle as the watched request that have a lower priority than the watched request will be after the watched request in the priority rankings and are not relevant in determining the priority of the watched. Any requests received in the same clock cycle as the watched request that have a higher priority will precede the watched request in the priority rankings.

As described with respect to FIG. 5, where the handshake in vector and the mask are implemented as bit vectors, a masked handshake in vector representing the requests that have a priority greater than or equal to the watched request (i.e. the watched request itself) may be generated by performing a bit-wise AND on the handshake in vector and the mask. Once the masked handshake in vector has been generated the method 800 proceeds to block 820.

At block 820 the number the number of new requests received that have a priority equal to or higher than the watched request is determined from the masked handshake in vector generated in block 818. This can also be described as determining the number of new requests received by, or input to, the arbiter less the number of those requests which have a lower priority than the watched request. Where the masked handshake in vector is implemented as a bit vector the number of new requests that have a priority equal to or higher than the priority of the watched request may be determined by counting the number of ones in the masked handshake in vector. The method 800 then proceeds to block 822 where the increment value is set to the number determined in block 820. The method 800 then ends.

In some cases blocks 816 to 822 are only executed if there is at least one other request (in addition to the watched request) that is received in the current clock cycle. In particular, in these cases the mask is only applied to the handshake in vector if one other request was received in the same clock cycle as the watched request. For example, in these cases, prior to proceeding to block 816 the counter update logic 208 may determine if more than one request was received in the current clock cycle. If it is determined that only one request (i.e. the watched request) was received in the current clock cycle then the increment value is set to one. If, however, it is determined that more than one request (i.e. the watched request plus at least one other request) was received in the current clock cycle then the method proceeds to block 816.

Figure 9:
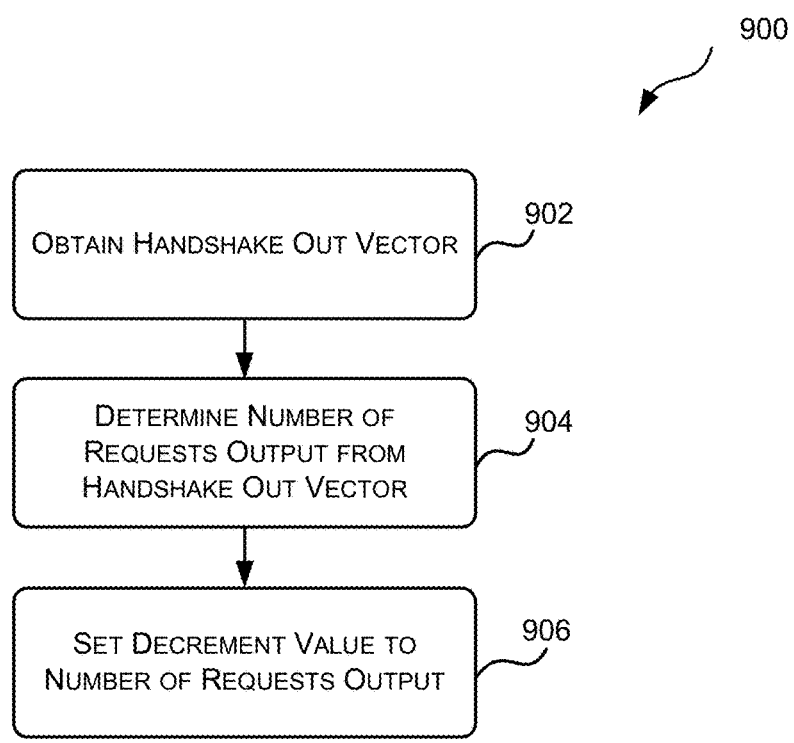
FIG. 9 is a flow chart of an example method for determining the counter decrement value.

Reference is now made to FIG. 9 which illustrates a method 900 for determining a decrement value for the counter which may be executed at block 710 of the method 700 of FIG. 7. The method 900 begins at block 902 where the handshake out vector is obtained by the counter update logic 208. Once the handshake out vector is obtained the method 900 proceeds to block 904.

At block 904 the number of requests output in the current clock cycle is determined from the handshake out vector. In particular, as described above, the handshake out vector indicates whether any requests were output from the arbiter, and, if so, which input ports the output requests relate to or are associated with. Where the arbiter can only output one request per clock cycle then the number of requests output is either one or zero. Where the handshake out vector is implemented as a bit vector the number of requests output may be determined by counting the ones in the handshake out vector. For example, if the handshake out vector were [0 0 1 0], the number of ones in the handshake out vector is one, indicating one request was output by the arbiter. Once the number of requests output in the current clock cycle is determined the method 900 proceeds to block 906 where the decrement value is set to the number determined in block 904. The method 900 then ends.

Reference is now made to FIG. 10 which shows an example timing diagram of the signals and/or registers in the verification system 200 illustrating verification of an arbiter that has four requestors (and thus four input ports) and can only output one request per clock cycle. Input port 1 is the watched port and the mask is [0 0 1 1] indicating that input port 0 has a higher priority than the watched port (input port 1) and input ports 2 and 3 have a lower priority.

The following is a summary of the signals and/or register values shown in FIG. 10:
clk is the clock
handshake_in is the handshake in vector 212
masked_handshake_in is the handshake in vector 212 after it has been bit-wise ANDed with the mask
handshake_out is the handshake out vector 214
sample_in is a flag that is set when a watched request is received by or input to the arbiter
sample_out is a flag that is set when a watched request is output from the arbiter
counter is the counter 218

In this example, the counter and flags (sample_in and sample_out) are adjusted in the clock cycle immediately following the activity causing an update. For example, if a request is received in clock cycle 1, the counter is incremented in clock cycle 2.

The assertion in this example asserts that in the clock cycle immediately following clock cycle the watched request is the highest priority request (i.e. the counter is equal to one and the sample_in flag is set) then the watched request should be output (i.e. the sample_out flag is set). An example implementation of the assertion (named "ordering") is shown below:

```
ordering: assert property
  (`clk_rst sample_in && hsk_out_glbl (counter == 1)
  |=> sample_out);
``` where clk_rst is equal to @ (posedge clk) disable iff (!resetn) indicating that the assertion is evaluated on the rising or positive edge of the clock (clk), and hsk_out_glbl is a wire indicating that an output handshake is happening in that clock cycle (i.e. a request is being output in that cycle). Although the assertion shown above is written SVA, it will be evident to a person of skill in the art that the assertion could be written in other languages.

Prior to clock cycle 1 the system 200 is initialized so that sample_in, sample_out and counter are set to 0.

In the first clock cycle a request is received on port 0. In the next clock cycle (clock cycle 2) the counter is incremented by one to reflect the fact there is one pending request in the arbiter. This is summarized below:

Clock Cycle 1

| Requests Input | Priority of Pending Requests | Requests Output | Counter |
|---|---|---|---|
| Requestor 0 | Requestor 0 | None | 0 |

In the second clock cycle a request is received on port 3. In the next clock cycle (clock cycle 3) the counter is incremented by one since there is one new pending request. The request from port 0 received in the first clock cycle is output so the counter is decrement by one in the next clock cycle (clock cycle 2). As a result the counter will remain at one in the next clock cycle (clock cycle 3). This is summarized below:

Clock Cycle 2

| Requests Input | Priority of Pending Requests | Requests Output | Counter |
|---|---|---|---|
| Requestor 3 | Requestor 3 | Requestor 0 | 1 |

In the third clock cycle three requests are received—ports 0, 1 and 2. Since port 1 is the watched port a watched request has been received and the sample_in flag is set in the next clock cycle (clock cycle 4). Also the mask is applied to the handshake in vector to determine which of these received requests have a lower priority than the watched request. This results in a masked handshake in vector of [0 0 1 1]. Since there are only two requests remaining in the masked handshake in vector the counter is incremented by two in the next clock cycle (clock cycle 4). The request received from port 3 is output so the counter is decremented by one in the next clock cycle (clock cycle 4). As a result the final value of the counter in the next clock cycle (clock cycle 4) is 2 indicating that the watched request is the second highest priority pending request. This is summarized below:

Clock Cycle 3

| Requests Input | Priority of Pending Requests | Requests Output | Counter |
|---|---|---|---|
| Requestor 0, Requestor 1, Requestor 2 | Requestor 0, Requestor 1, Requestor 2 | Requestor 3 | 1 |

In the fourth clock cycle a request is received on port 3. The counter is not incremented in the next clock cycle (clock cycle 5) since the sample_in flag is set indicating a watched request has already been received. The request from port 0 received in the third clock cycle is output so the counter is decrement in the next clock cycle (clock cycle 5) by one. As a result, in the next clock cycle (clock cycle 5), the counter falls to 1 indicating the watched request is the highest priority pending request. This is summarized below:

Clock Cycle 4

| Requests Input | Priority of Pending Requests | Requests Output | Counter |
|---|---|---|---|
| Requestor 3 | Requestor 1, Requestor 2, Requestor 3 | Requestor 0 | 2 |

In the fifth clock cycle a request is received on port 0. The counter is not incremented in the next clock cycle (clock cycle 6) since the sample_in flag is set indicating a watched request has already been received. The watched request (the request from port 1) is output. The sample_out flag is set in the next clock cycle (clock cycle 6) indicating the watched request is output and the counter is decremented by one to zero. This is summarized below:

Clock Cycle 5

| Requests Input | Priority of Pending Requests | Requests Output | Counter |
|---|---|---|---|
| Requestor 0 | Requestor 2, Requestor 3, Requestor 0 | Requestor 1 | 1 |

Since the counter is equal to one and sample_in is high in the fifth clock cycle the watched request (the request corresponding to input port 1) should be output in the fifth clock cycle (indicated by sample_out being set in the sixth clock cycle) for the assertion to be true. If this is not the case then an error will have occurred and an indication of the error is output (e.g. a message may be output indicating the error).

Reference is now made to FIG. 11 which shows an example timing diagram of the signals and/or registers in the verification system 200 illustrating verification of an arbiter that has four requestors (and thus four input ports) and can output up to two requests per clock cycle. Input port 1 is the watched port and the mask is [0 0 1 1] indicating that input port 0 has a higher priority than the watched port (input port 1) and input ports 2 and 3 have a lower priority than the watched port (input port 1).

The same signals/registers as shown in FIG. 10 are shown in FIG. 11. The following additional signal is also shown:
outputs_active—which is equal to the the total number of requests output in a clock cycle The assertion in this example asserts that the watched request (indicated by the sample_out flag) is should be output in the clock cycle immediately following clock cycle in which the priority of the watched request (indicated by the counter and sample_in) is less than or equal to the number of requests output. An example SVA assertion (named "ordering_multiple_output") is shown below:

```
ordering_multiple_output: assert property
  (`clk_rst sample_in && (counter <=outputs_active)
  |=> sample_out);
``` where clk_rst is equal to @ (posedge clk) disable iff (!resetn) indicating that the assertion is evaluated on the rising or positive edge of the clock (clk), Although the assertion shown above is in SVA, it will be evident to a person of skill in the art that the assertion could be replicated in other languages.

Prior to clock cycle 1 the system 200 is initialized so that sample_in, sample_out and counter are set to 0.

In the first clock cycle a request is received on ports 0 and 2. In the next clock cycle (clock cycle 2) the counter is incremented by two to reflect the fact there are two pending requests in the arbiter. This is summarized below:

Clock Cycle 1

| Requests Input | Priority of Pending Requests | Requests Output | Counter |
|---|---|---|---|
| Requestor 0, Requestor 2 | Requestor 0, Requestor 2 | None | 0 |

In the second clock cycle a request is received on port 3. The counter is thus incremented in the next clock cycle (clock cycle 3) by one since there is one new pending request. The request from port 0 received in the first clock cycle is output so the counter is decrement by one in the next clock cycle (clock cycle 3). As a result the counter will remain at two in the next clock cycle (clock cycle 3). This is summarized below:

Clock Cycle 2

| Requests Input | Priority of Pending Requests | Requests Output | Counter |
|---|---|---|---|
| Requestor 3 | Requestor 2, Requestor 3 | Requestor 0 | 2 |

In the third clock cycle three requests are received on ports 0, 1 and 2. Since port 1 is the watched port a watched request has been received and the sample_in flag is set in the next clock cycle (clock cycle 4). Also the mask is applied to the handshake in vector to determine which of these received requests have a lower priority than the watched request. This results in a masked handshake in vector of [0 0 1 1]. Since there are only two requests remaining in the masked handshake in vector the counter is incremented by two in the next clock cycle (clock cycle 4). The request received from port 3 is output so the counter is decremented by one in the next clock cycle (clock cycle 4). As a result the final value of the counter in the next clock cycle (clock cycle 4) is 3 indicating that the watched request is the third highest priority pending request. This is summarized below:

Clock Cycle 3

| Requests Input | Priority of Pending Requests | Requests Output | Counter |
|---|---|---|---|
| Requestor 0, Requestor 1, Requestor 2 | Requestor 3, Requestor 0, Requestor 1, Requestor 2 | Requestor 2 | 2 |

In the fourth clock cycle a request is received on port 3. The counter is not incremented in the next clock cycle (clock cycle 5) since the sample_in flag is set indicating a watched request has already been received. The request from port 3 received in the second clock cycle is output so the counter is decremented in the next clock cycle (clock cycle 5) by one. As a result, in the next clock cycle (clock cycle 5), the counter falls to 2 indicating the watched request is the second highest priority pending request. This is summarized below:

Clock Cycle 4

| Requests Input | Priority of Pending Requests | Requests Output | Counter |
|---|---|---|---|
| Requestor 3 | Requestor 0, Requestor 1, Requestor 2, Requestor 3 | Requestor 3 | 3 |

In the fifth clock cycle a request is received on port 0. The counter is not incremented in the next clock cycle (clock cycle 6) since the sample_in flag is set indicating a watched request has already been received. The request from input port 0 and the watched request (the request from port 1) are output. The sample_out flag is set in the next clock cycle (clock cycle 6) indicating the watched request has been output and the counter is decremented by two to zero. This is summarized below:

Clock Cycle 5

| Requests Input | Priority of Pending Requests | Requests Output | Counter |
|---|---|---|---|
| Requestor 0 | Requestor 2, Requestor 3, | Requestor 0, Requestor 1 | 2 |

Since the counter is less than or equal to the number of requests output and sample_in is high in the fifth clock cycle the watched request (the request corresponding to input port 1) should be output in the fifth clock cycle (indicated by sample_out being set in the sixth clock cycle) for the assertion to be true. If this is not the case then an error will have occurred and an indication of the error is output (e.g. a message may be output indicating the error).

Figure 12:
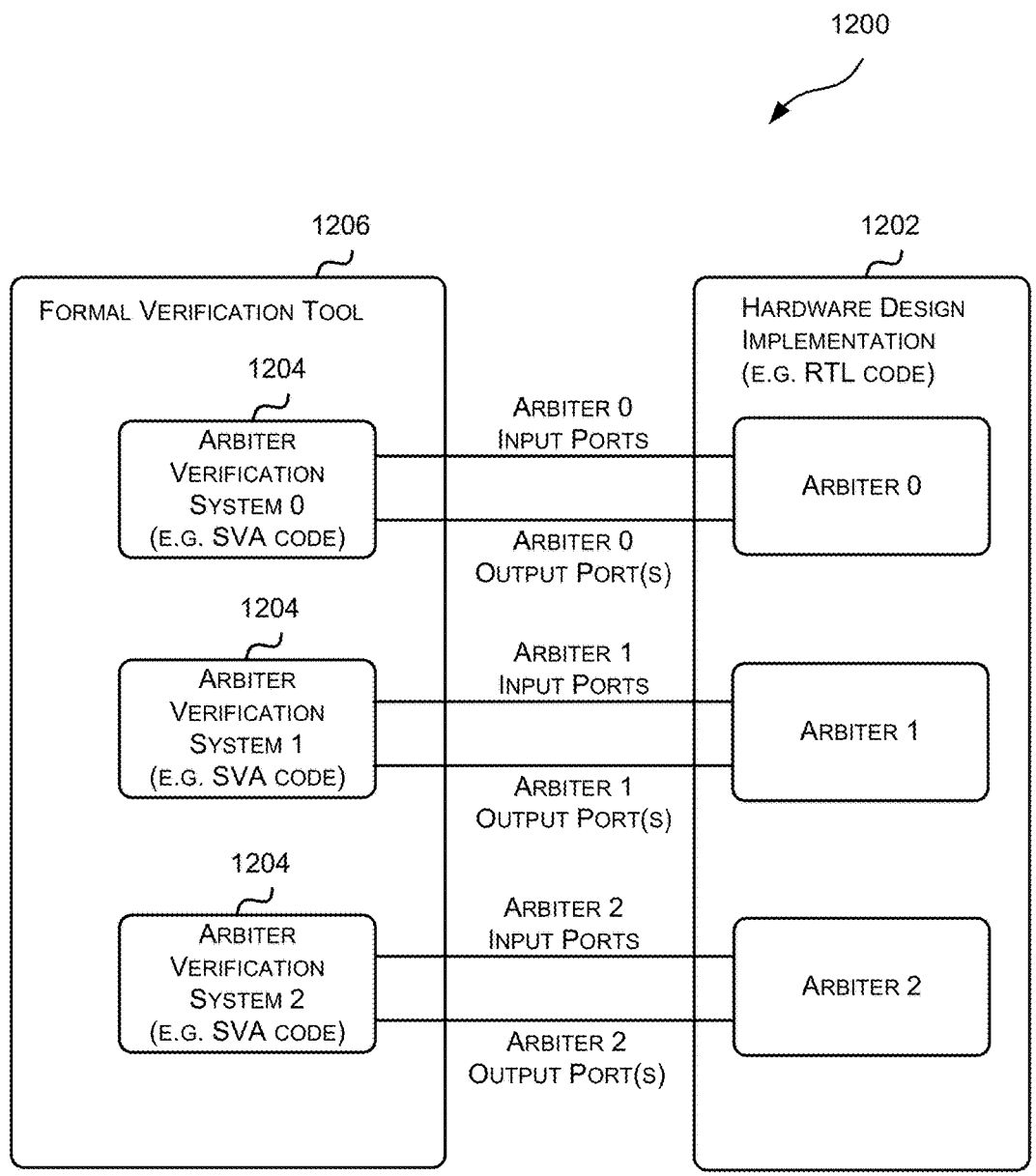
FIG. 12 is a block diagram of a system for verifying the arbiters of a hardware design using the system of FIG. 2.
Figure 13:
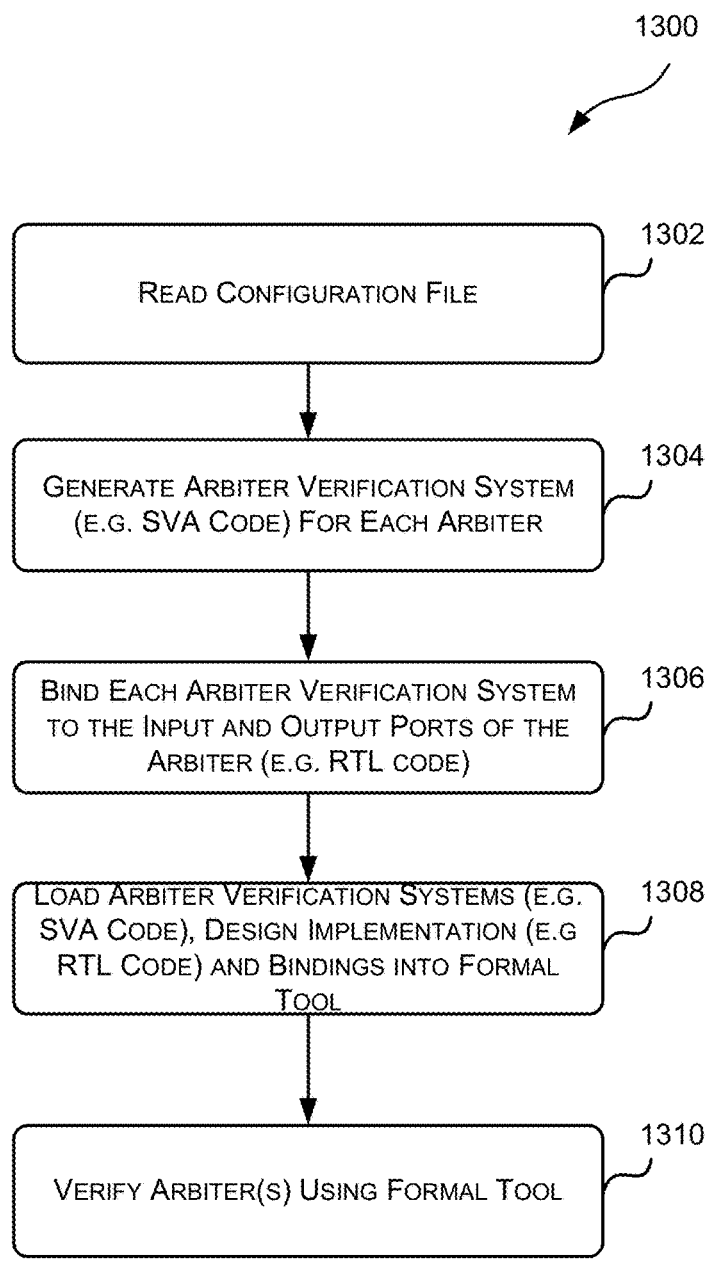
FIG. 13 is a flow chart of an example method for verifying the operation of the arbiters of a hardware design using the system of FIG. 12.

Reference is now made to FIGS. 12 and 13 which illustrate how the arbiter verification system 200 of FIG. 2 may be used in formal verification to verify one or more arbiters in a hardware design (e.g. SoC design). In particular, FIG. 12 illustrates an example formal verification test system 1200 and FIG. 13 illustrates a flow chart of a method 1300 for implementing the test system 1200. At block 1302 a configuration file (e.g. the specification) is read which identifies each arbiter in the design implementation 1202 and specifies the arbitration scheme for each arbiter, and the handshake signals for each input and output port of each arbiter. For each arbiter identified in the configuration file an instance 1204 of the arbiter verification system 200 is generated at block 1304. For example, where the arbiter verification system 200 is implemented in SV, an SV instance 1204 of the arbiter verification system is created for each arbiter using the arbitration schemes and handshake signals specified in the configuration file.

Once an instance 1204 of the arbiter verification system 200 has been created for each arbiter, at block 1306 each instance 1204 is bound to the corresponding input and output ports of the design implementation 1202. For example, where the design is implemented in RTL and the arbiter verification system is implemented in SV, each SV instance is bound to the corresponding input and output ports in the RTL code.

Once each arbiter verification system (e.g. SV instance) has been bound to the design implementation (e.g. RTL code), at block 1308 the arbiter verification systems (e.g. SV code), design implementation (e.g. RTL code) and bindings are loaded into a formal verification tool 1206, such as, but not limited to, Cadence IEV, Jasper's Jasper Gold, and OneSpin, to establish the test environment.

At block 1310 the formal verification tool 1206 is then used to verify the operation of the arbiters in the design implementation (e.g. RTL code) using the defined assertions.

Figure 14:
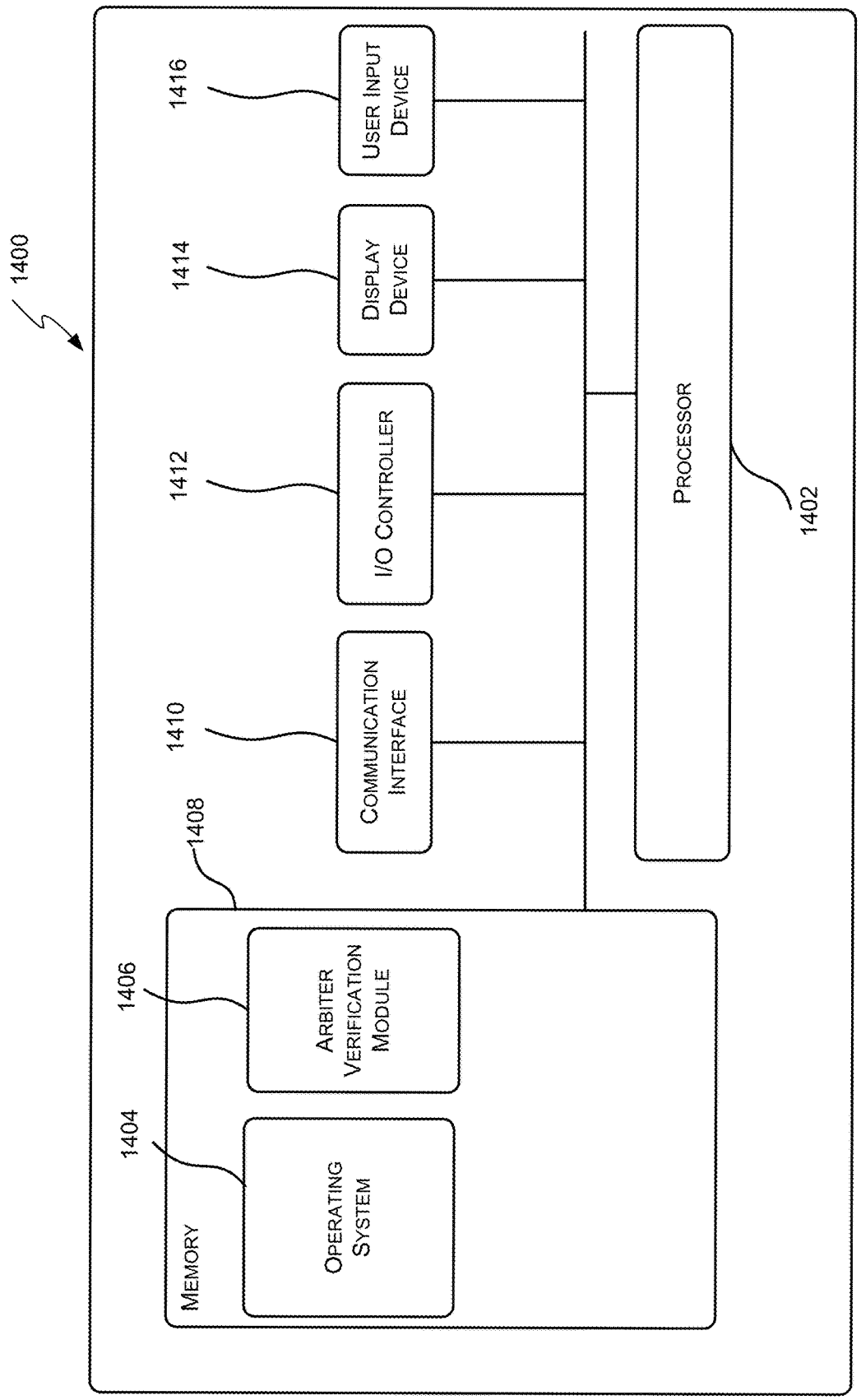
FIG. 14 is a block diagram of an example computing-based device.

FIG. 14 illustrates various components of an exemplary computing-based device 1400 which may be implemented as any form of a computing and/or electronic device, and in which embodiments of the systems and method described herein may be implemented.

Computing-based device 1400 comprises one or more processors 1402 which may be microprocessors, controllers or any other suitable type of processors for processing computer executable instructions to control the operation of the device in order to verify the operation of an arbiter in a hardware design. In some cases, for example where a system on a chip architecture is used, the processors 1402 may include one or more fixed function blocks (also referred to as accelerators) which implement a part of the method of verifying an arbiter in hardware (rather than software or firmware). Platform software comprising an operating system 1404 or any other suitable platform software may be provided at the computing-based device to enable application software 1406 to be executed on the device.

The computer executable instructions may be provided using any computer-readable media that is accessible by computing based device 1400. Computer-readable media may include, for example, computer storage media such as memory 1408 and communications media. Computer storage media (i.e. non-transitory machine readable media), such as memory 1408, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 1408) is shown within the computing-based device 1400 it will be appreciated that the storage may be distributed or located remotely and accessed via a network or other communication link (e.g. using communication interface 1410).

The computing-based device 1400 also comprises an input/output controller 1412 arranged to output display information to a display device 1414 which may be separate from or integral to the computing-based device 1400. The display information may provide a graphical user interface. The input/output controller 1412 is also arranged to receive and process input from one or more devices, such as a user input device 1416 (e.g. a mouse or a keyboard). This user input may be used to initiate verification. In an embodiment the display device 1414 may also act as the user input device 1416 if it is a touch sensitive display device. The input/output controller 1412 may also output data to devices other than the display device, e.g. a locally connected printing device (not shown in FIG. 14).

The term 'processor' and 'computer' are used herein to refer to any device, or portion thereof, with processing capability such that it can execute instructions. The term 'processor' may, for example, include central processing units (CPUs), graphics processing units (GPUs or VPUs), physics processing units (PPUs), radio processing units (RPUs), digital signal processors (DSPs), general purpose processors (e.g. a general purpose GPU), microprocessors, any processing unit which is designed to accelerate tasks outside of a CPU, etc. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

It is also intended to encompass software which "describes" or defines the configuration of hardware that implements a module, functionality, component or logic described above, such as HDL (hardware description language) software, as is used for designing integrated circuits, or for configuring programmable chips, to carry out desired functions. That is, there may be provided a computer readable storage medium having encoded thereon computer readable program code for generating a processing unit configured to perform any of the methods described herein, or for generating a processing unit comprising any apparatus described herein. That is, a computer system may be configured to generate a representation of a digital circuit from definitions of circuit elements and data defining rules for combining those circuit elements, wherein a non-transitory computer readable storage medium may have stored thereon processor executable instructions that when executed at such a computer system, cause the computer system to generate a processing unit as described herein. For example, a non-transitory computer readable storage medium may have stored thereon computer readable instructions that, when processed at a computer system for generating a manifestation of an integrated circuit, cause the computer system to generate a manifestation of a processor of a receiver as described in the examples herein or to generate a manifestation of a processor configured to perform a method as described in the examples herein. The manifestation of a processor could be the processor itself, or a representation of the processor (e.g. a mask) which can be used to generate the processor.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of verifying operation of an arbiter in a hardware design, the arbiter receiving a plurality of requests over a plurality of clock cycles, the plurality of requests comprising a watched request, the method comprising, in a processor:
    identifying, for each clock cycle, any requests received by the arbiter in that clock cycle;
    identifying, for each clock cycle, any requests output from the arbiter in that clock cycle;
    tracking a priority of the watched request relative to other pending requests in the arbiter using a counter, the counter updated based on the requests identified as being received by and output from the arbiter in each clock cycle and a mask identifying a relative priority of requests received by the arbiter in a same clock cycle; and
    verifying operation of the arbiter using an assertion written in an assertion-based language, the assertion establishing a relationship between the counter and a clock cycle in which the watched request is output from the arbiter.

2. A system arranged to verify operation of an arbiter in a hardware design, the arbiter receiving a plurality of requests over a plurality of clock cycles, the plurality of requests comprising a watched request, the system comprising:
    request in logic configured to identify, for each clock cycle, any requests received by the arbiter in that clock cycle;
    request out logic configured to identify, for each clock cycle, any requests output by the arbiter in that clock cycle;
    counter update logic configured to track a priority of the watched request relative to other pending requests in the arbiter using a counter, the counter updated based on the requests identified as being received by and output from the arbiter in each clock cycle and a mask identifying a relative priority of requests received by the arbiter in a same clock cycle; and
    assertion verification logic configured to verify the operation of the arbiter using an assertion written in an assertion-based language, the assertion establishing a relationship between the counter and the clock cycle in which the watched request is output from the arbiter.

3. The system of claim 2, wherein the assertion establishes that in the clock cycle in which the counter drops below a predetermined value, the watched request is output from the arbiter.

4. The system of claim 2, wherein the assertion establishes that in the clock cycle in which the counter is equal to a predetermined value, the watched request is output from the arbiter.

5. The system of claim 2, wherein the counter update logic is configured to track the priority of the watched request relative to the other pending requests in the arbiter by, during each clock cycle:
    determining whether the watched request was received by the arbiter in a current clock cycle;
    in response to determining that the watched request was not received by the arbiter in the current clock cycle, determining whether the watched request was input to the arbiter in a previous clock cycle;
    in response to determining that the watched request was not received by the arbiter in a previous clock cycle:
        determining a number of requests input to the arbiter in the current clock cycle; and
        incrementing the counter by the number of requests input to the arbiter in the current clock cycle;
    in response to determining that the watched request was received by the arbiter in the current clock cycle:
        determining a number of requests input to the arbiter in the current clock cycle having a priority equal to or higher than the watched request using the mask; and
        incrementing the counter by the number of requests input to the arbiter in the current clock cycle that have a priority equal to or higher than the watched request;
    determining a number of requests output from the arbiter in the current clock cycle; and
    decrementing the counter by the number of requests output from the arbiter in the current clock cycle.

6. The system of claim 5, wherein the request in logic is configured to identify any requests input to the arbiter in a particular clock cycle by generating a handshake in vector indicating which input ports of a plurality of input ports of the arbiter received a request in the particular clock cycle.

7. The system of claim 6, wherein the handshake in vector is implemented as a bit vector comprising a bit for each input port of the arbiter and the counter update logic is configured to determine the number of requests input to the arbiter by counting a number of ones in the handshake in vector.

8. The system of claim 6, wherein the handshake in vector is implemented as a bit vector comprising a bit for each input port of the arbiter and the mask is implemented as a bit vector comprising a bit for each input port of the arbiter; and the counter update logic is configured to determine the number of requests input to the arbiter in the current clock cycle having a priority equal to or higher than the watched request by performing a bit-wise AND operation on the handshake in vector and the mask to generate a masked handshake in vector.

9. The system of claim 8, wherein the counter update logic is further configured to determine the number of requests received by the arbiter that have a priority equal to or higher than the watched request by counting a number of ones in the masked handshake in vector.

10. The system of claim 2, wherein the request out logic is configured to identify any requests output from the arbiter in a particular clock cycle by generating a handshake out vector indicating which input port of the arbiter any request output in the particular clock cycle corresponds to.

11. The system of claim 10, wherein the handshake out vector is implemented as a bit vector comprising a bit for each input port of the arbiter and the counter update logic is configured to determine the number of requests output from the arbiter in the clock cycle by counting a number of ones in the handshake out vector.

12. The system of claim 2, wherein the arbiter is configured to output a maximum of one request each clock cycle.

13. The system of claim 2, wherein the arbiter is configured to output more than one request each clock cycle.

14. The system of claim 2, further comprising mask generation logic configured to dynamically generate the mask based on an arbitration scheme.

15. The system of claim 2, wherein the mask is dynamically selected each clock cycle based on an arbitration scheme.

16. A non-transitory computer readable storage medium having stored thereon computer readable instructions that, when processed at a computer system for generating a manifestation of an integrated circuit, cause the computer system to generate a manifestation of a system as set forth in claim 2.

17. A non-transitory computer readable storage medium having stored thereon computer executable instructions that when executed cause at least one processor to:
  identify, for each clock cycle, any requests received by an arbiter in a hardware design in that clock cycle;
  identify, for each clock cycle, any requests output from the arbiter in that clock cycle;
  track a priority of a watched request relative to other pending requests in the arbiter using a counter, the counter updated based on the requests identified as being received by and output from the arbiter in each clock cycle and a mask identifying a relative priority of requests received by the arbiter in a same clock cycle; and
  verify operation of the arbiter using an assertion written in an assertion-based language, the assertion establishing a relationship between the counter and a clock cycle in which the watched request is output from the arbiter.

* * * * *